United States Patent [19]

Matsuyama

[11] Patent Number: 5,149,375
[45] Date of Patent: Sep. 22, 1992

[54] APPARATUS FOR FORMING A DEPOSITED FILM OF LARGE AREA WITH THE USE OF A PLURALITY OF ACTIVATED GASES SEPARATELY FORMED

[75] Inventor: Jinsho Matsuyama, Nagahama, Japan

[73] Assignee: Canon Kabushiki Kaisha, Tokyo, Japan

[21] Appl. No.: 707,943

[22] Filed: May 28, 1991

Related U.S. Application Data

[60] Continuation of Ser. No. 550,197, Jul. 10, 1990, which is a division of Ser. No. 376,869, Jul. 7, 1989.

[30] Foreign Application Priority Data

| Jul. 14, 1988 | [JP] | Japan | 63-173758 |
| Jul. 14, 1988 | [JP] | Japan | 63-173759 |
| Jul. 14, 1988 | [JP] | Japan | 63-173760 |

[51] Int. Cl.$^5$ ............ C23C 16/48; C23C 16/50
[52] U.S. Cl. ............ 118/719; 118/723; 118/725
[58] Field of Search ............ 118/719, 723, 725

[56] References Cited

U.S. PATENT DOCUMENTS

| 4,568,614 | 2/1986 | Eichen et al. | 428/450 |
| 4,689,093 | 8/1987 | Ishihara et al. | 118/723 |
| 4,696,834 | 9/1987 | Varaprath | 427/249 |
| 4,702,934 | 10/1987 | Ishihara et al. | 427/45.1 |
| 4,727,293 | 2/1988 | Asmussen et al. | 315/111.41 |
| 4,737,379 | 4/1988 | Hudgens et al. | 427/39 |
| 4,745,337 | 5/1988 | Pichot et al. | 315/111.21 |
| 4,759,993 | 7/1988 | Pai et al. | 428/450 |

FOREIGN PATENT DOCUMENTS

| 59-157278 | 9/1984 | Japan | 118/729 |
| 62-298106 | 12/1987 | Japan | 118/723 |
| 2148328 | 5/1985 | United Kingdom . | |

*Primary Examiner*—Richard Bueker
*Attorney, Agent, or Firm*—Fitzpatrick, Cella, Harper & Scinto

[57] ABSTRACT

An apparatus for forming a deposited film of large area comprised of a plurality of constituents, in which two film-forming raw material gases are respectively activated by a decomposing energy in respective activation chambers. The thus activated gases are introduced respectively for mixing via respective gas introducing ports into a film-forming chamber wherein the activated gases are caused to react with each other near the surface of a substrate disposed in the film-forming chamber, thereby forming said deposited film on the substrate. Each of the gas introducing ports has a rectangular or elliptic shape with the length of the longer axis being at least twice that of the shorter axis, and the gas introducing ports are disposed in parallel with each other at a distance less than the length of the shorter axis thereof. A rod-like microwave transmission antenna, a filament made of a metallic material capable of exhibiting a catalytic effect or a pair of plate-like electrodes for generating RF electric field are disposed in each of the activation chambers as the means for generating the decomposing energy.

2 Claims, 22 Drawing Sheets

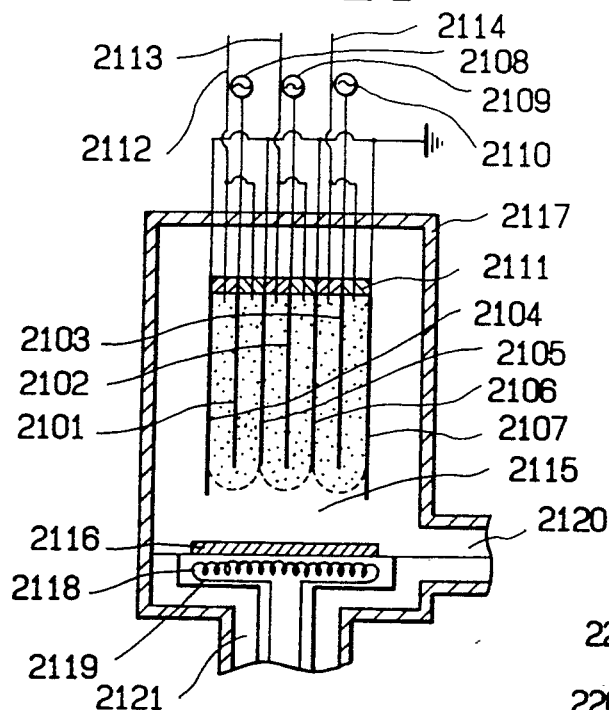
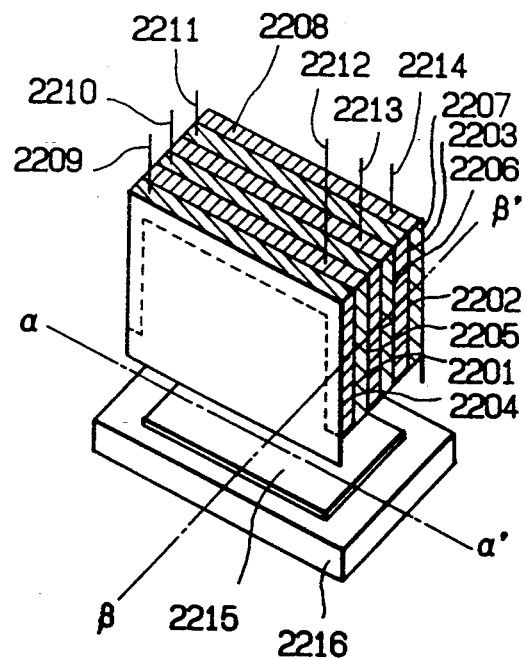
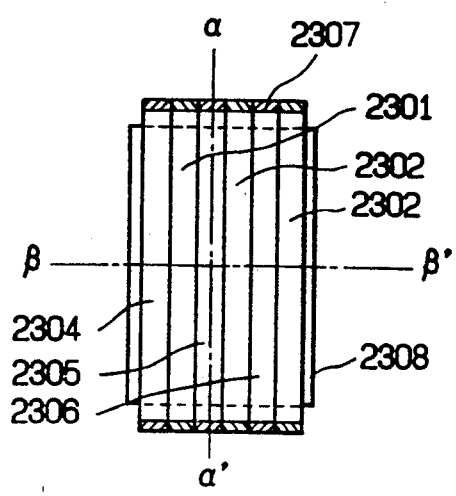

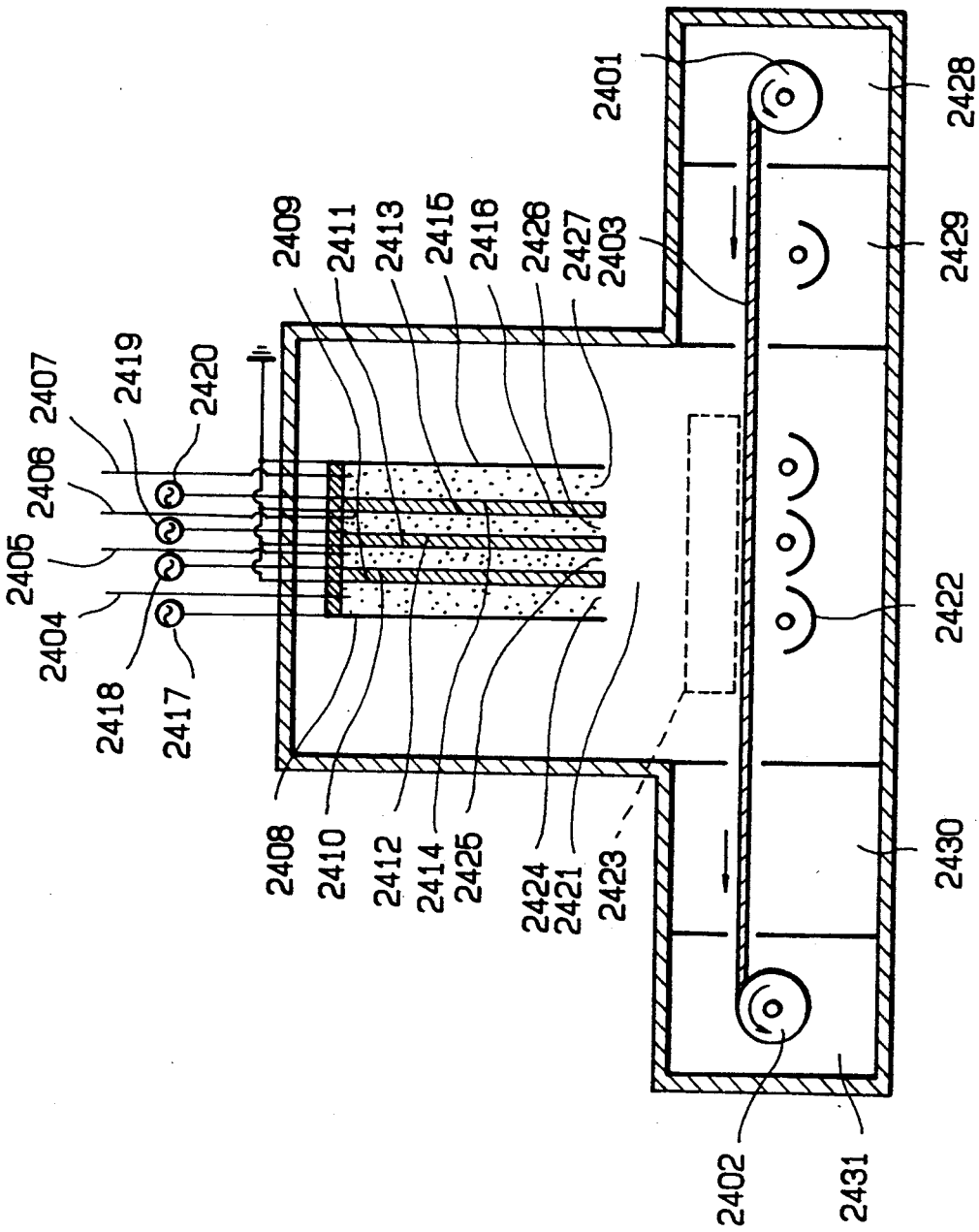

APPARATUS FOR FORMING A DEPOSITED FILM OF LARGE AREA WITH THE USE OF A PLURALITY OF ACTIVATED GASES SEPARATELY FORMED

This application is a continuation of application Ser. No. 07/550,197 filed Jul. 10, 1990, now abandoned, which is a division of application Ser. No. 07/376,869 filed Jul. 7, 1989, now abandoned.

FIELD OF THE INVENTION

The present invention relates to an improved apparatus for forming a functional deposited film by a gas phase growing method wherein a plurality of activated film-forming gases which are separately formed are used. More particularly, the present invention relates to an improved apparatus capable of forming a functional deposited film over a large area which makes it possible to independently control the amount of each of the constituents for a film to be formed.

BACKGROUND OF THE INVENTION

The production of semiconductor devices such as photoinput sensor devices, photosensitive devices for electrophotography, photovoltaic devices, liquid crystal driving circuits, etc., has caused a great demand for forming a deposited film over a large area at a reduced cost.

Heretofore, for forming a deposited film using a gas phase growing method, it is known that a deposited film of large area can be formed by using plasma, heat, light, etc. as the energy for decomposing a film-forming raw material gas. A single film-forming raw material gas is seldom used in any case. A dilution gas is usually used in addition to the film-forming raw material gas even in the case where a deposited film comprising a single component is to be formed. In addition, in the case of forming a deposited film comprising a plurality of constituents by the gas phase growing method, a gaseous mixture comprising a plurality of film-forming raw material gases is generally introduced into a film-forming chamber.

However, any of the conventional deposited film-forming methods involves the following problems:

Initially, even in the case where a deposited film comprising a single component is to be formed, various film-forming parameters have to be optimized, including the mixing ratio between the film-forming raw material gas and the dilution gas, in order for the resulting deposited film to be provided with desired properties. In this case, the allowable ranges for the film-forming parameters are relatively narrow. Further in the case of forming a deposited film comprising a plurality of constituents, a plurality of film-forming raw material gases for the respective film-constituents have different levels of decomposing energy. Accordingly, various film-forming parameters such as flow rate ratios among the film-forming raw material gases to be introduced into the film-forming chamber are often more restricted in comparison with depositing a film of a single component. In addition, there is also a problem that it is rather difficult to change the flow rate ratios so as not to reduce the quality of the film to be obtained.

Further, upon decomposing said plurality of film-forming raw material gases, various relevant conditions have to be controlled in a delicate manner and, accordingly, controllable ranges for the film property and the film composition are also to be limited.

In order to overcome the foregoing problems, a method has been proposed to subject each of a plurality of film-forming raw material gases to the action of an activation energy, independently in a respective activation chamber situated separately from a film-forming chamber; subsequently introducing each of the resultant activated film-forming raw material gases separately into the film-forming chamber, mixing and reacting them with each other to thereby cause the formation of a deposited film on a substrate therein (see, for example, Japanese Patent Laid Open Publication No. ho.61(1986) 179869. According to this method, the activation of the respective film-forming gases can be controlled independently. Because of this, it is possible to extend the range of the film-forming parameters for improving the film property when forming a film comprising a single component. It is also possible to provide film-forming parameters in a wide range wherein the desired quality of the resulting deposited film is ensured as is the case when forming a deposited film comprising a plurality of constituents.

However, in regard to the apparatus for practicing the foregoing later film-forming method, there is difficulty in forming a deposited film over a large area as compared with the apparatus for practicing the foregoing prior method for forming a deposited film using a gas mixture.

That is, with respect to the conventional method, it is possible to form a deposited film having a large area as long as the decomposing energy can be evenly applied over a wide range onto the gaseous mixture, thereby resulting in the formation of a deposited film on a substrate having a large area. The related film-forming parameters may then be properly adjusted in the film-forming chamber.

However, in the case of the foregoing later method, the respective film-forming raw material gases are firstly activated separately in respective activation chambers situated separately from the film-forming chamber before the respective resultant activated film-forming gases are separately introduced into the film-forming chamber and mixed and reacted with each other. A deposited film is thereby formed on a substrate therein. Unevenness is apt to occur in the thickness and/or the quality of a deposited film thereby obtained. Because of this, it is extremely difficult to form a desirable deposited film having a large area which is uniform in thickness and of high quality by using this method. A typical apparatus suitable for practicing this method is one provided with a plurality of nozzle or ring-like gas-liberating ports as shown in FIG. 25. In the practice of this method, using the apparatus as shown in FIG. 25, unevenness is apt to occur in the thickness and the quality of a deposited film obtained because of differences in the distances between said plurality of nozzles or ring-like gas-liberating ports. Thus, this method is unsatisfactory for forming a desired deposited film having a large area and which is uniform in both thickness and quality.

SUMMARY OF THE INVENTION

The object of the present invention is to overcome the foregoing problems in the prior art and provide an apparatus which makes it possible to form a functional deposited film having a large area which is comprised of a plurality of constituents and which is uniform in both thickness and quality by the foregoing later method. In this method a plurality of film-forming raw material gases are activated independently to form a plurality of activated film-forming gases in their respective activation spaces, and the resultant of activated film-forming gases are mixed and reacted with each other to form said functional deposited film on a substrate in a film-forming space.

The present inventor has made extensive studies in order to overcome the foregoing problems in the prior art and to attain the object of the present invention. As a result, it has been discovered that in the case of forming a deposited film comprised of a plurality of constituents there are features in the conventional apparatus that effect thickness and quality of the film. This apparatus comprising a plurality of activation chambers, in each of which a plurality of film-forming raw material gases are independently activated by an activation energy into an activated film-forming gas in plasma state and a film-forming chamber which provides a plurality of gas feed means respectively having a gas introducing port opening near a substrate positioned on a substrate holder therein; said plurality of activated film-forming gases in plasma states being separately introduced through respective gas introducing ports into said film-forming chamber, wherein said plurality of activated film-forming gases in plasma states thus introduced being mixed and reacted with each other to cause the formation of a deposited film on said substrate; the configuration of each of said gas introducing ports and the respective distances among said plurality of gas introducing ports are influential in affecting the thickness and the quality of a deposited film having a large area.

The present invention has been accomplished as a result of further studies based upon the above finding. The present invention includes the following three aspects.

An apparatus according to the first aspect of the present invention has the following constitution.

An apparatus for forming a deposited film having a large area comprised of a plurality of constituents by activating two or more film-forming raw material gases with the action of a decomposition energy in separate respective activation chambers wherein each of the plurality of activation chambers has a rod-like microwave transmission antenna. The thus activated gases are introduced through respective gas introducing ports into a film-forming chamber, and mixed and reacted with each other near the surface of a substrate disposed in the film-forming chamber, thereby forming said deposited film on the substrate. The respective film-forming raw material gases are activated into a plasma state around the rod-like antenna by microwaves transmitted to the rod-like antenna, and each of the activated gases is transported in a direction perpendicular to the direction of the longitudinal axis of the rod-like antenna. Each of the gas introducing ports is designed in a rectangular or elliptic shape with the length of the longer axis thereof being at least twice the length of the shorter axis and said plurality of gas introducing ports are disposed parallel to one another at a distance less than the length of the shorter axis.

An apparatus according to the second aspect of the present invention has the following constitution.

An apparatus for forming a deposited film of large area comprised of a plurality of constituents and activating two or more film-forming raw material gases with the action of a decomposition energy in their respective activation chambers, introducing the thus activated gases through respective gas introducing ports into a film-forming chamber, and mixing and reacting the activated gases with each other near the surface of a substrate disposed in the film-forming chamber, thereby forming said deposited film on the substrate. Each of said plurality of activation chambers has a filament made of a metal material capable of exhibiting a catalytic effect. Each of the film-forming raw material gases is activated into a plasma state by the action of heat generated from electric power supplied to the filament and each of the activated gases is transported in a direction perpendicular to the direction of the longitudinal axis of the filament. Each of the gas introducing ports is designed in a rectangular or elliptic shape, with the length of the longer axis being at least twice that of the shorter axis and said plurality of gas introducing ports are disposed in parallel with each other at a distance less than the length of the shorter axis.

An apparatus according to the third aspect of the present invention has the following constitution.

An apparatus for forming a deposited film having a large area comprised of a plurality of constituents and activating two or more film-forming raw material gases with the action of a decomposition energy in respective activation chambers. The thus activated gases being introduced through respective gas introducing ports into a film-forming chamber, and mixing and reacting the activated gases with each other near the surface of a substrate disposed in the film-forming chamber, thereby forming said deposited film on the substrate. Each of said plurality of activation chambers has a pair of plate-like electrodes. Each of the film-forming raw material gases is activated into a plasma state by the action of RF electric field generated by the application of an electric power between the electrodes. Each of the activated gases is transported in a direction perpendicular to the direction of the RF electric field applied, and each of the gas introducing ports is designed in a rectangular or elliptic shape with the length of the longer axis being at least twice that of the shorter axis and said plurality of gas introduction ports are disposed in parallel with each other at a distance less than the length of the shorter axis.

In any one of the apparatuses, according to the present invention, it is possible to form a homogenous deposited film having a large area due to the advantage of maintaining delicate control over the film quality and over the ratio of the constituents for the deposited film over a wide range. Thus deterioration of the film quality is prevented by independently controlling the activation ratio for a plurality of film-forming gases.

BRIEF DESCRIPTION OF THE DRAWINGS

FIG. 21 is a cross sectional view, taken along the shorter axis, for one embodiment of an apparatus for forming a deposited film according to the third aspect of the present invention.

FIG. 22 is an explanatory view of the inside of the apparatus for forming the deposited film shown in FIG. 21.

FIG. 23 is an explanatory view of the gas-introduction port in the apparatus for forming the deposited film as shown in FIG. 21

FIG. 24 is a cross sectional view of another embodiment of an apparatus for forming a deposited film according to the third aspect of the present invention.

DETAILED DESCRIPTION OF THE INVENTION

Figure 1:
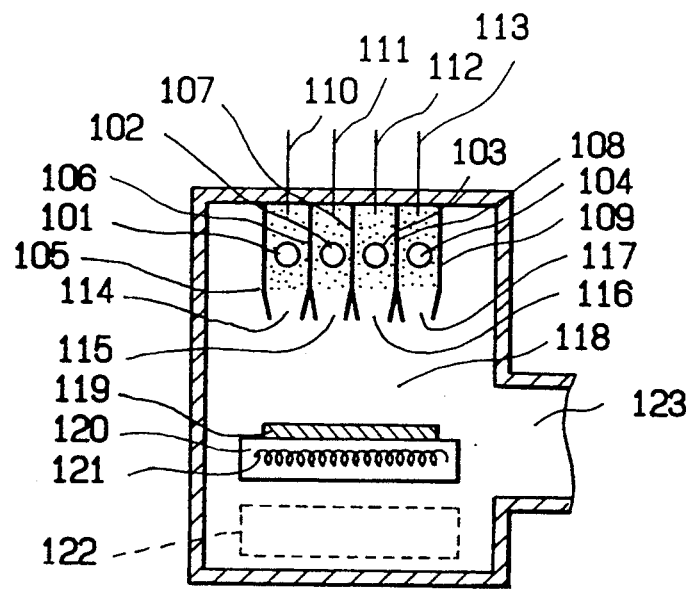
FIG. 1 is a schematic cross sectional view for a fundamental embodiment of an apparatus for forming a deposited film according to the first aspect of the present invention, viewed in the direction of the shorter axis.

The present invention is explained more specifically by referring to the drawings.

FIG. 1 is a schematic cross sectional view, taken along the shorter axis, for one fundamental embodiment of an apparatus for forming a deposited film according to the first aspect of the present invention. In the drawing, reference numerals 101–104 denote rod antennas for transmitting microwaves. Microwaves are transmitted from a wave guide to a rod antenna thereby causing electric discharge to film-forming starting material gases at the periphery of the rod antenna and activating the gases. The rod antenna may be made of metal material such as SUS and Ni, or dielectric material such as $SiO_2$ and $Al_2O_3$. The diameter of the rod antenna is properly determined depending upon the kind of material, the diameter of the wave guide and the entire volume of the film-forming chamber which is desirably from 10 mm to 100 mm. Further, the required length of the rod antenna is determined, depending upon the area of the deposited film to be formed. By transmitting the microwaves to the rod antenna thereby generating plasmas around it, great electric power can be charged by the microwaves and the film-forming gas can be activated uniformly in an elongated shape.

The film-forming gases thus activated respectively are introduced from a plurality of gas-introduction ports 114–117 each of which are in a rectangular or elliptic shape; the length of the longer axis being at least twice that of the shorter axis, and disposed in parallel with each other within a narrow distance which is less than the length of the shorter axis. The activated gases are mixed and brought into reaction with each other to form a deposited film on a substrate 119.

Figure 2:
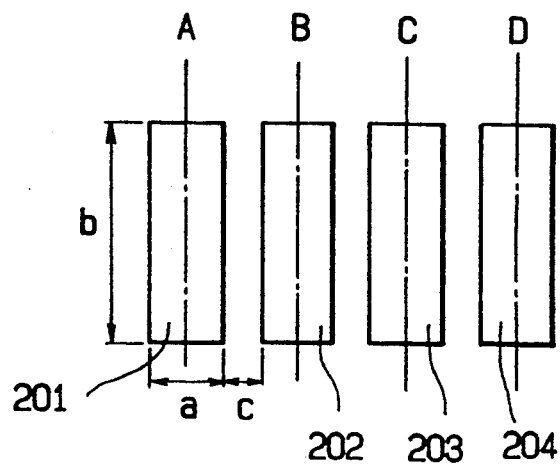
FIG. 2 is a view illustrating the configuration of a gas introduction port in an apparatus for forming a deposited film according to the present invention.

FIG. 2 is a view illustrating the shape of the gas-introduction port for introducing the activated gas into the film-forming space. For a plurality of rectangular introduction ports 201–204, assuming that the length of the shorter axis as a, the length of the longer axis as b and the distance between each of the gas introduction ports as c, it has been noted that the distribution of the thickness and the quality of the deposited film formed varies depending upon the ratio a:b:c.

Figure 3:
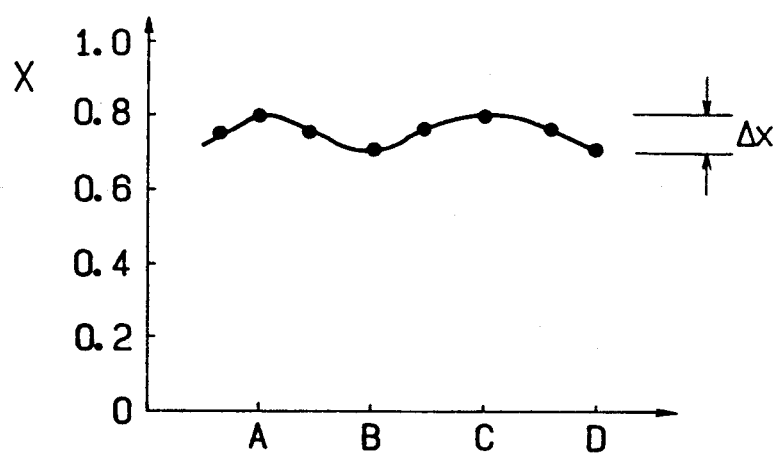
FIG. 3 is a graph for the distribution of the ratio of component in the deposited film, formed by the apparatus for forming the deposited film shown in FIG. 1, corresponding to the position of the gas introduction port shown in FIG. 2.

For instance, in a case where SiH diluted with $H_2$ to 10% (hereinafter referred to as $SiH_4/H_2$) and Getty diluted with $H_2$ to 5% (hereinafter referred to as Getty/$H_2$) and are separately activated by applying microwaves, to deposit hydrogenated amorphous SiGe (hereinafter simply referred to as a-SiGe:H), an unevenness occurs in the film composition of a-SiGe:H depending on the ratio a:b:c. FIG. 3 illustrates the unevenness of the ratio of components in a deposited film in a case where active species of SiH$_4$ are introduced from the gas introduction ports 201 and 203 and the active species of GeH$_4$ are introduced from the gas introduction ports 202 and 204. The abscissa indicates the position along the shorter axis of the gas-introduction port, in which A, B, C, D correspond to the positions of the gas-introduction ports 201-204 shown in FIG. 2. The ordinate indicates the ratio x of components in a-Si$_x$Ge$_{1-x}$:H.

Figure 4:
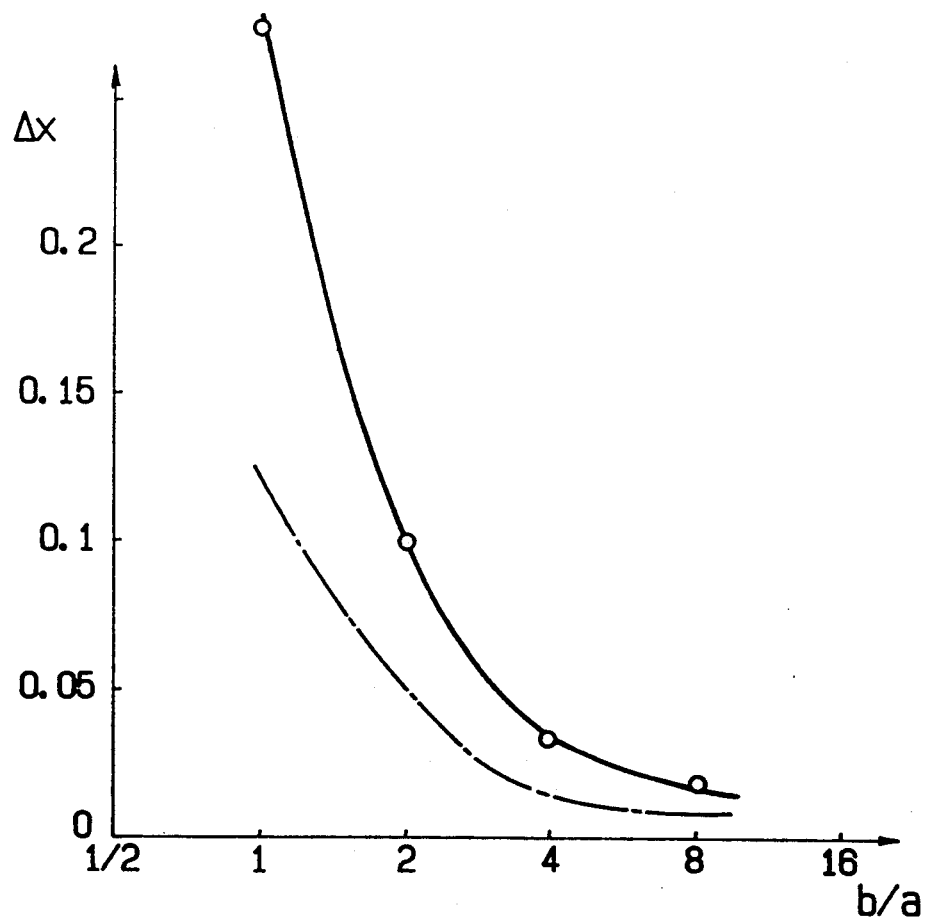
FIG. 4 is a graph illustrating a relationship between the variation range for the ratio of component in the deposited film formed by the apparatus for forming the deposited film shown in FIG. 1 and the shape of the gas introduction port.
Figure 5:
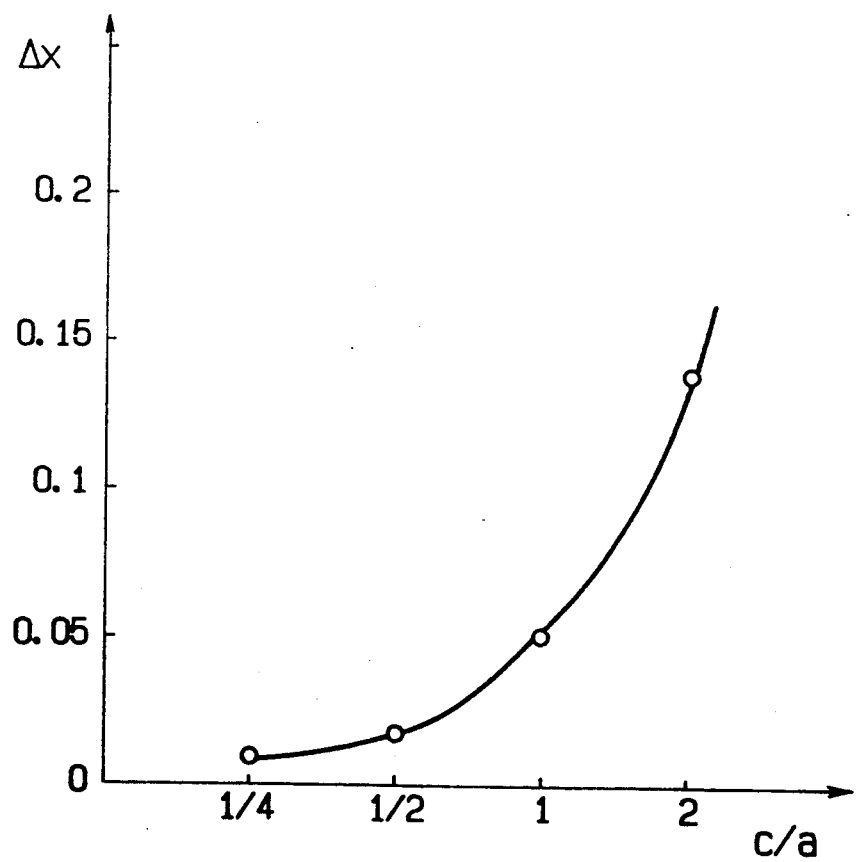
FIG. 5 is a graph illustrating a relationship between the variation range for the ratio of component in the deposited film formed by the apparatus for forming the deposited film shown in FIG. 1 and the arrangement of the gas introduction port.

The unevenness in the film composition is shown here as the variation range $\Delta x$ for x (in which x is determined by X-ray microanalyzer measurement). In an apparatus in which b/a and c/a are changed respectively, the variation range $\Delta x$ for the ratio x of components when the a-SiGe:H films of the same composition are formed is shown in FIGS. 4 and 5. As evident from FIGS. 4 and 5, it has been noted that the scattering $\Delta x$ for the ratio x of components in SixGe-1x film along the shorter axis is greatly reduced by setting the ratio b/a, i.e., the longer axis-to-shorter axis ratio to greater than 2 and setting the distance between each of the introduction ports to the length of the shorter axis (c/a) to less than 1.

When b/a was varied in FIG. 4, the longer axis was made constant as 20 cm and the length of the shorter axis was changed. Further, upon varying b/a, the ratio c/a was set to ½. Further, upon varying b/a, the ratio c/a/ was set to ½. Further, upon varying c/a, a is fixed to 2.5 cm and b is fixed to 20 cm. The flow rates for SiH$_4$/H$_2$ and GeH$_4$/H$_2$ were set to 800 sccm respectively where a=20 cm and b=20 cm. In a case where a was varied, the flow rates were varied in proportion with the change of a and the inner pressure of the film-forming chamber being 20 mm Torr, the microwave power applied was 800 W on the side of SiH$_4$/H$_2$ and 300 W on the side of GeH$_4$/H$_2$. The distance between the gas-introduction port and the substrate was set to 8 cm. If the distance between the gas introduction port and the substrate is made, for example, as large as 16 cm, the scattering $\Delta x$ of the ratio of components can be decreased as shown in the graph of FIG. 4. However, since the deposition rate is reduced to less than ¼ as compared with the case where the distance is set to 8 cm, it is not practical to improve the homogeneity of the deposited film by increasing the distance between the gas introduction port and the substrate.

The above-mentioned example shows the relationship between the shape and the arrangement of the gas introduction ports and the homogeneity of the deposited film in a case where a-SiGe:H film was deposited by activating SiH$_4$/H$_2$ and GeH$_4$/H$_2$ separately and then mixing the thus activated gases and reacting them. Also in the case of forming a deposited film of another composition such as a-SiC:H film or a deposited film of a single component, similar effects to those in the foregoing example can be obtained in any of the cases where a plurality of gases are activated separately.

That is, the ratio of the longer axis to shorter axis of a rectangular or elliptical gas introduction port is, preferably, not less than 2, more preferably, not less than 4 and, most suitably, not less than 8. Further, the ratio of the distance between each of the gas introduction ports to the length of the shorter axis is preferably not less than ½ and, most suitably, not greater than ¼. It is possible to greatly improve the homogeneity of the deposited film by disposing the gas introduction ports having such a shape in such an arrangement. The region for forming the deposited film can be increased to a desired area by setting the length of the gas introduction port in the direction of the longer axis. Further, the region for forming the deposited film can be increased to a desired area by increasing the number of the introduction ports disposed in parallel along the direction of the shorter axis. Accordingly, it is possible to form a deposited film uniformly over a desired area while separately activating a plurality of film-forming gases.

Further, it is possible to continuously form a deposited film over an even greater area in the direction of the shorter axis by moving the substrate along the shorter axis as in an apparatus for forming a deposited film to be detailed later and shown in FIG. 17. Furthermore, the homogeneity of the film quality along the direction of the shorter axis can also be further improved by moving the substrate.

In the apparatus for forming a deposited film according to the present invention, in which a plurality of film-forming gases are activated separately, thereby controlling the activation ratio for a plurality of film-forming gas independently, it is possible to form a uniform deposited film over a large area while maintaining the capability of controlling the film quality or the ratio of the components of the deposited film over a wide range and in a delicate manner without deteriorating the film quality.

The plurality of film-forming gases used in the apparatus for forming the deposited film according to the present invention comprises two or more kind of gases, each of which may be a gas mixture as the film-forming gases described previously. Further, the present invention is not restricted by the kind of film-forming gases.

Partition plates 105-109 constituting the rectangular or elliptic gas introduction ports may or may not be in parallel with one another. Further, their material may be SUS or Al, which may be plated with Ni.

Figure 6:
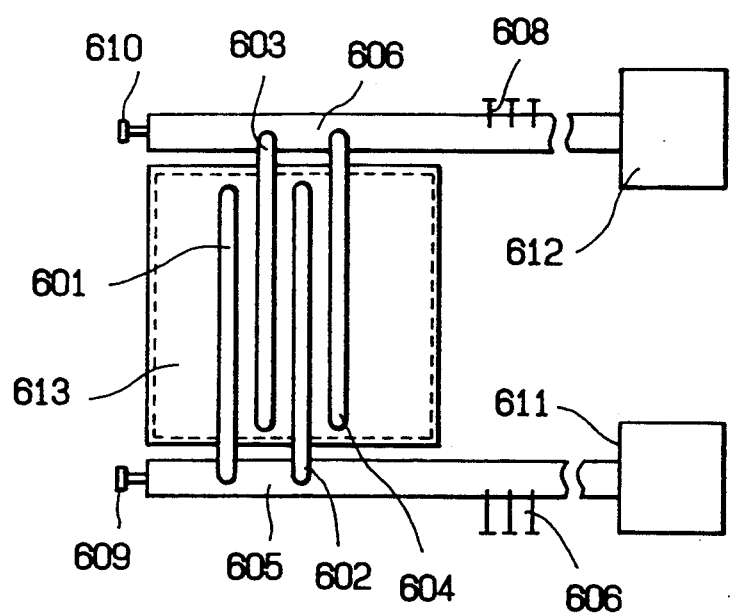
FIG. 6 is an explanatory view of the apparatus for forming the deposited film shown in FIG. 1, viewed from above.

The rod antenna for transmitting the microwave has to be attached vertically to the wave guide as shown in FIG. 6 and has to be insulated from the film-forming chamber with SiO$_2$, Al$_2$O$_3$, etc. in order to charge great electric power. In the case of increasing the number of gas introduction ports in the direction of the shorter axis, it is possible to attach a plurality of rod antennas to one wave guide. In this case, the electric power distributed to each of the rod antennas can be controlled depending upon the portion of the rod antenna to be attached to the wave guide. Further, the reflection wave is controlled to be as low as possible by means of terminal ends 609, 610 and tuners 607 and 608.

Figure 7:
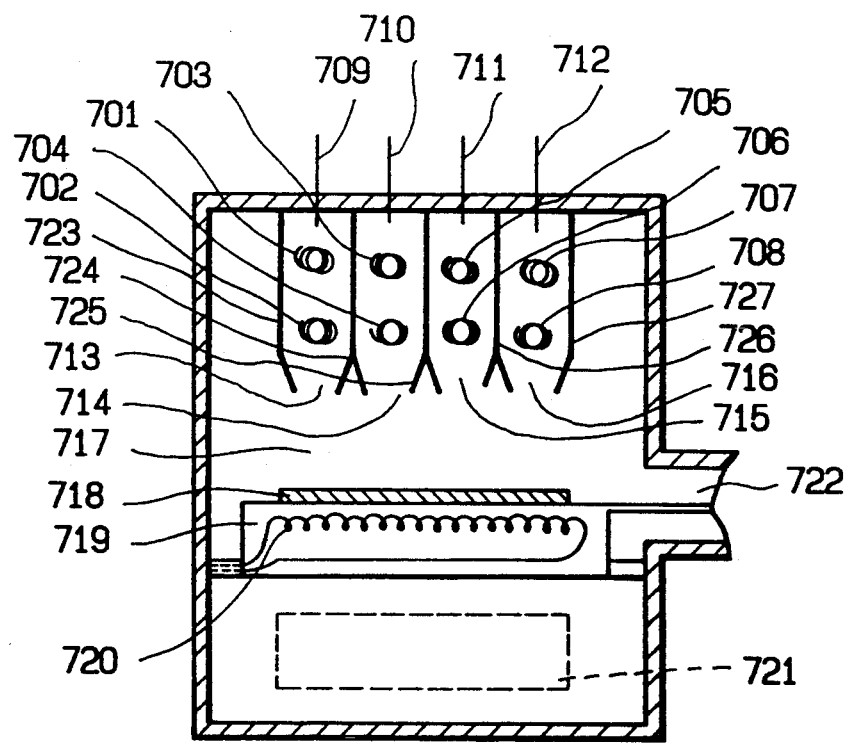
FIG. 7 is a cross sectional view of a fundamental embodiment of an apparatus for forming a deposited film in the second aspect of the present invention, viewed along the shorter axis.

FIG. 7 is a cross sectional view of one fundamental embodiment of an apparatus for forming a deposited film according to the second feature of the present invention, in which long filaments 701-708 are wound spirally. The entire length of the filament is determined as desired depending upon the area of the deposited film to be formed. While the suitable values for the winding diameter and the number of turns are different depending upon the length of the filament and the entire size of the apparatus, it is desirable that the winding diameter is from 3 to 30 mm and the number of turns is from 1 to 20 turns/cm.

The long filaments 701-708 are caused to generate heat thereby activating the film-forming starting material gases. The activated gases are transported in the direction vertical to the longer axis of the filament. It is thus possible to introduce the active species of gases in an elongated form over a wide range uniformly into the film-forming space.

As in the apparatus shown in FIG. 7, a plurality of filaments may be disposed in the direction of transporting the gases, by which means the activating efficiency for the film-forming starting material gases can be improved. The material for the filament is selected from transition metal elements belonging to the group IVA, VA, VIA, VIIA of the Periodic Table, such as Sr, Hf, La, Mo, Nb, Re, Ta, Tc, Ti, V, W, Zr or group VIII element such as Pd, Pt, Rh, Ir. Among the elements described above, Mo, Ta, W, Pd and Pt and, most suitably, W are selected in view of heat resistance and reaction resistance.

The shape of the filament may be a coil as mentioned above or a plate or mesh shape, with which similar effects can be obtained. In the plate-like form, the thickness, width and the shape of the plate, material of the plate and the resistance value thereof are selected by taking into consideration that a desired heater temperature can be obtained in the same manner as in the coil-like form, so that Joule heat is generated by electric current flowing under the application of a voltage to enable heating and reaction. In the case of the mesh-like shape, the situation is the same as for the plate-like form.

The entire size of the plate or mesh-like filament is determined depending upon the shape of the gas introduction port. Further, a plurality of plates and filaments may be arranged in the direction of transporting the gas in the same manner as for the coils.

The temperature for the filament is selected as described above by taking into consideration the reactivity of the filament with various kinds of gases, heat resistance, etc. Generally the temperature is selected within a range from 800° C. to 2000° C.

Then, a plurality of activated gases are transported into a long region and introduced into the film-forming space by way of the rectangular or elliptic gas introduction ports 713-716. In this case, the shape of the gas introduction ports has a significant effect on the homogeneity of the deposited film to be formed.

FIG. 2 illustrates the shape of the gas introduction port for introducing the activated gas into the film-forming space. For a plurality of rectangular introduction ports 201-204, assuming that the length of the shorter axis as a, the length of the longer axis as b and the distance between each of the gas introduction ports as c, it has been noted that the distribution of the thickness and the quality of the deposited film formed varies depending on the ratio a:b:c.

Figure 8:
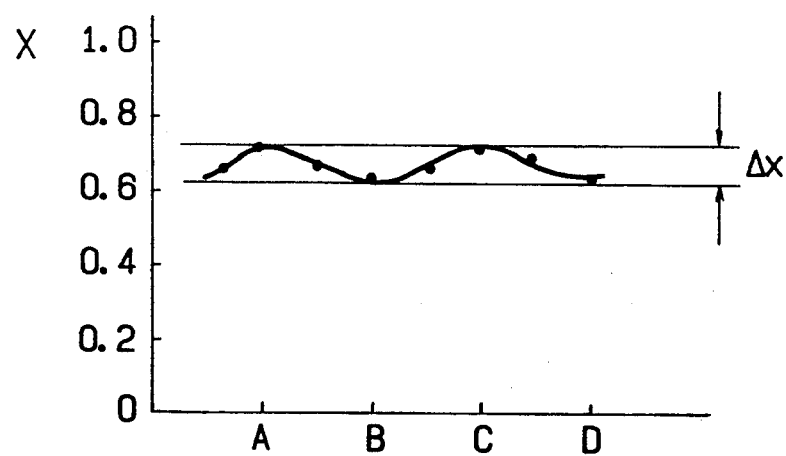
FIG. 8 is a graph for the distribution of the ratio of components, in the deposited film formed by the apparatus for forming the deposited film shown in FIG. 7 corresponding to the position of the gas introduction port shown in FIG. 2.

For instance, in a case where SiH4 diluted with H2 to 10% (hereinafter referred to as SiH4/H2) and GeH4 diluted with H2 to 5% (hereinafter referred to as GeH4/H2) are separately activated by the heat energy generated from the filament, to deposit hydrogenated amorphous SiGe (hereinafter simply referred to as a-SiGe:H), an unevenness occurs in the film composition of a-SiGe:H depending upon the ratio a:b:c. FIG. 8 illustrates the unevenness of the ratio of components in a deposited film in a case where active species of SiH4 are introduced from the gas introduction ports 201 and 203 and the active species of GeH4 are introduced from the gas introduction ports 202 and 204. The abscissa indicates the position along the shorter axis of the gas introduction port, in which A, B, C, D correspond to the positions for the gas introduction ports 201-204 shown in FIG. 2. The ordinate indicates the ratio x of components in a-Si$_x$Ge$_{1-x}$:H.

Figure 9:
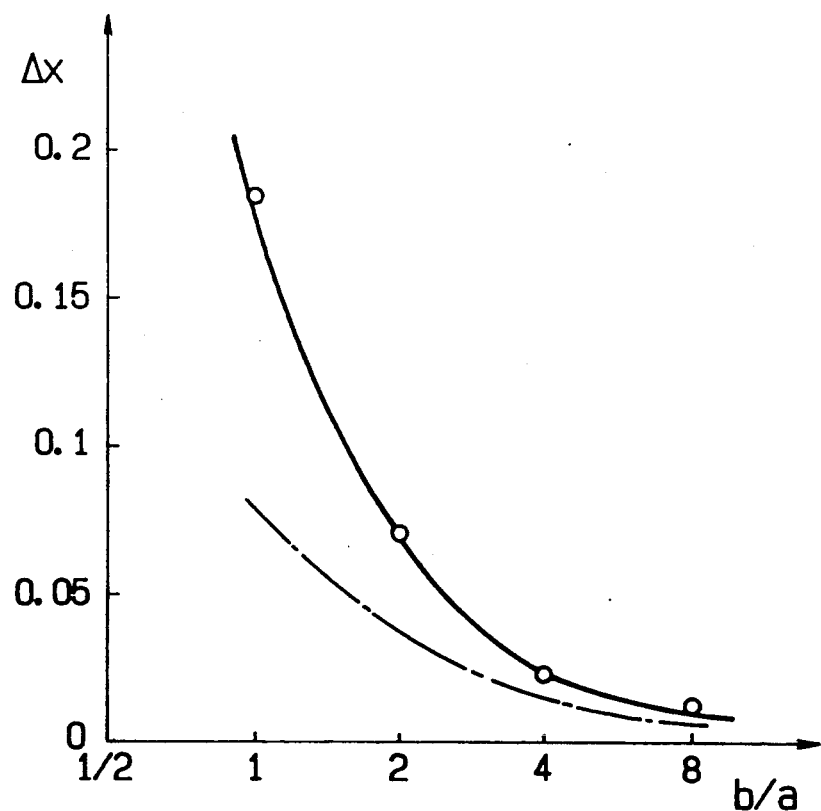
FIG. 9 is a graph illustrating a relationship between the variation range for the ratio of components in the deposited film formed by the apparatus for forming the deposited film shown in FIG. 7 and the shape of the gas introduction port.
Figure 10:
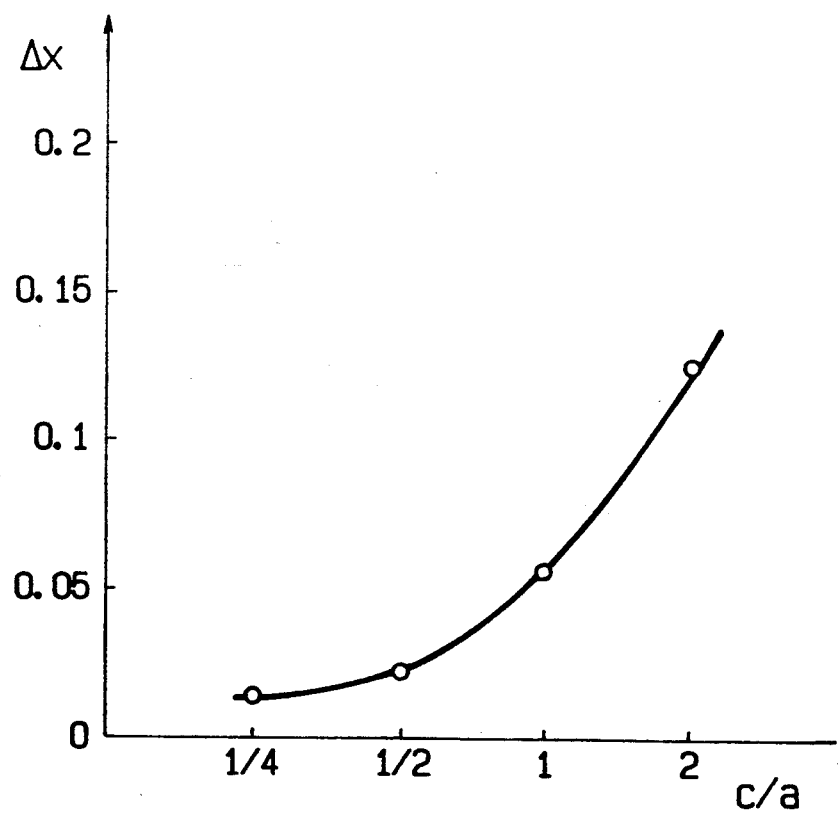
FIG. 10 is a graph illustrating a relationship between the variation range for the ratio of components in the deposited film formed by the apparatus for forming the deposited film shown in FIG. 7 and the arrangement of the gas introduction port.

The unevenness in the film composition is shown here as the variation range $\Delta x$ for x (in which x is determined by x-ray microanalyzer measurement). In an apparatus in which b/a and c/a are changed respectively, the variation range $\Delta x$ for the ratio x of components when the a-SeGe:H films of the same composition are formed is shown in FIGS. 9 and 10. As can be seen from FIGS. 9 and 10, it has been found that the scattering $\Delta x$ for the ratio x of components in Si$_x$Ge$_{1-x}$ film along the shorter axis is greatly reduced by setting the ratio b/a, that is, the longer axis-to-shorter axis ratio to greater than 2 and setting the distance between each of the introduction ports to the length of the shorter axis (c/a) to less than 1. When b/a is varied in FIG. 8, the longer axis was made constant as 8 cm and the length of the shorter axis was changed. Further, upon varying b/a, the ratio c/a was set to $\frac{1}{2}$. Further, upon varying c/a, a was fixed to 2 cm and b was fixed to 8 cm. The flow rates for SiH$_4$/H$_2$ and GeH$_4$/H$_2$ were set to 200 sccm respectively where a=8 cm and b=8 cm. In a case where a was varied, the flow rates were varied in proportion with the change of a. The inner pressure of the film-forming chamber was 0.6 Torr, the filament has an entire length of 8 cm, winding diameter of 5 mm and number of turns of 5 T/cm, and electric current was supplied so that the temperature was 1700° C. on the side of SiH$_4$/H$_2$ and 1500° C. on the side of GeH$_4$/H$_2$. Further, the distance between the gas introduction port and the substrate was set to 5 cm. If the distance between the gas introduction port and the substrate is made, for example, as large as 10 cm, the scattering $\Delta x$ of the ratio of components can be decreased as shown by the dotted chain in the graph of FIG. 9. However, since the deposition rate is reduced to less than $\frac{1}{4}$ as compared with the case where the distance is set to 5 cm, it is not practical to improve the homogeneity of the deposited film by increasing the distance between the gas introduction port and the substrate.

The above-mentioned example shows the relationship between the shape and the arrangement of the gas introduction ports and the homogeneity of the deposited film in a case where a-SiGe:H film was deposited by activating SiH$_4$/H$_2$ and GeH$_4$/H$_2$ separately and then mixing the thus activated gases and reacting them. Also in the case of forming a deposited film of another composition such as a-SiC:H film or a deposited film of a single component, similar effects to those in the foregoing example can be obtained in the cases where a plurality of gases are activated separately.

That is, the ratio of the longer axis-to-shorter axis of a rectangular or elliptic gas introduction port is, preferably, not less than 2, more preferably, not less than 4 and, most suitably, not less than 8. Further, the ratio of the distance between each of the gas introduction ports to the length of the shorter axis is preferably not less than $\frac{1}{2}$ and, most suitably, not greater than $\frac{1}{4}$.

It is possible to greatly improve the homogeneity of the deposited film by disposing the gas introduction ports having such a shape in such an arrangement. The region for forming the deposited film can be increased to a desired area by setting the length of the gas introduction port in the direction of the longer axis. Further, the region for forming the deposited film can be increased to a desired area by increasing the number of the introduction ports disposed in parallel along the direction of the shorter axis. Accordingly, it is possible to form a deposited film uniformly over a desired area by separately activating a plurality of film-forming gases.

Further, it is possible to continuously form a deposited film over an even greater area in the direction of the shorter axis by moving the substrate along the shorter axis, as in an apparatus for forming a deposited film to be detailed later and shown in FIG. 20. Furthermore, the homogeneity of the film quality along the direction of the shorter axis can also be further improved by moving the substrate.

In the apparatus for forming a deposited film according to the present invention, in which a plurality of film-forming gases are activated separately, thereby independently controlling the activation ratio for a plurality of film-forming gases, it is possible to form a uniform deposited film over a large area by maintaining the advantage of controlling the film quality or the ratio of the components of the deposited film over a wide range and in a delicate manner without deteriorating the film quality.

The plurality of the film-forming gases used in the apparatus for forming the deposited film according to the present invention comprises two or more kinds of gases, each of which may be a gas mixture as the film-forming gases described previously. Further, the present invention is not restricted by the kind of film-forming gases.

Partition plates 723-727 constituting the rectangular or elliptic gas introduction ports may or may not be in parallel with each other. Further, their material may be SUS or Al, which may be plated thereover with Ni.

For the distance between the gas introduction port and the filament, a preferred position varies depending upon the kind, flow rate, pressure, etc. of the film-forming starting material and it is, desirably, from 0 to 100 mm. In the case of the film-forming starting material gas having short life of active species, the distance is desirably shorter than the case of the film-forming starting material gas having longer life of the active species.

Figure 11:
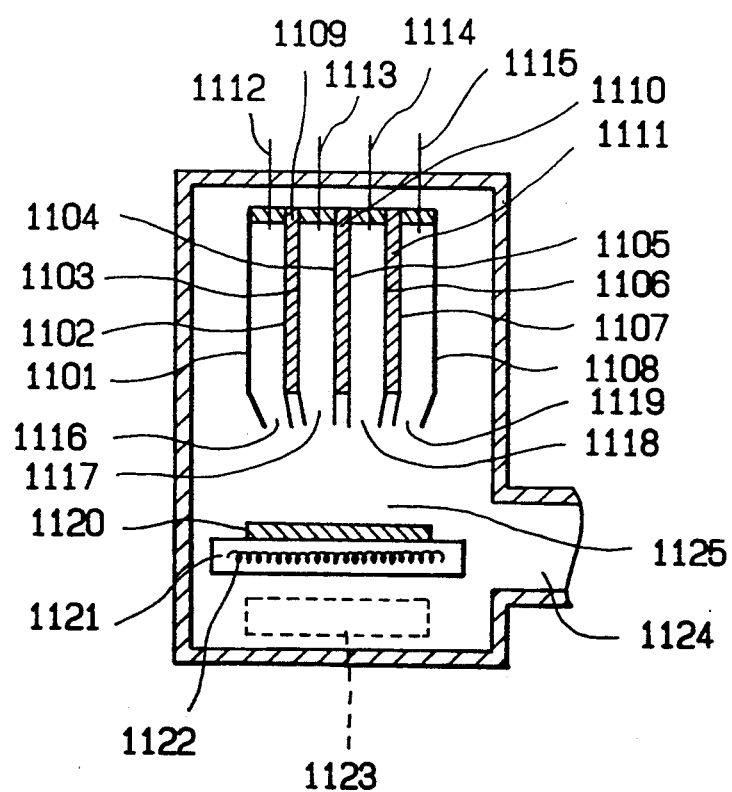
FIG. 11 is a cross sectional view for a fundamental embodiment of an apparatus for forming a deposited film in the third aspect of the present invention, viewed along the shorter axis.

FIG. 11 is a cross sectional view for one fundamental embodiment of an apparatus for forming a deposited film according to the third aspect of the present invention, as viewed in the direction of the shorter axis. 1101-1108 denote four pairs of flat parallel electrodes. RF electric field is applied between each of the electrodes to separately activate a plurality of film-forming starting material gases. Further, the space between each set of parallel flat electrodes is insulated and separated by means of insulators 1109-1111. A plurality of film-forming gases are activated into plasmas between each set of flat and parallel electrodes, transported in the direction vertical to RF electric field applied. That is, in the direction parallel with the plane of the electrode. They are then introduced from gas introduction ports 1116-1119 into a film-forming space 1125, and mixed and reacted with each other to form a deposited film on a substrate 1120. FIG. 2 is a view illustrating the shape of the gas introduction port for introducing the activated gas into the film-forming space. For a plurality of rectangular introduction ports 201-204, assuming that the length of the shorter axis as a, the length of the longer axis as b and the distance between each of the gas introduction ports as c, it has been noted that the distribution of the thickness and the quality of the deposited film formed varies depending on the ratio a:b:c.

Figure 12:
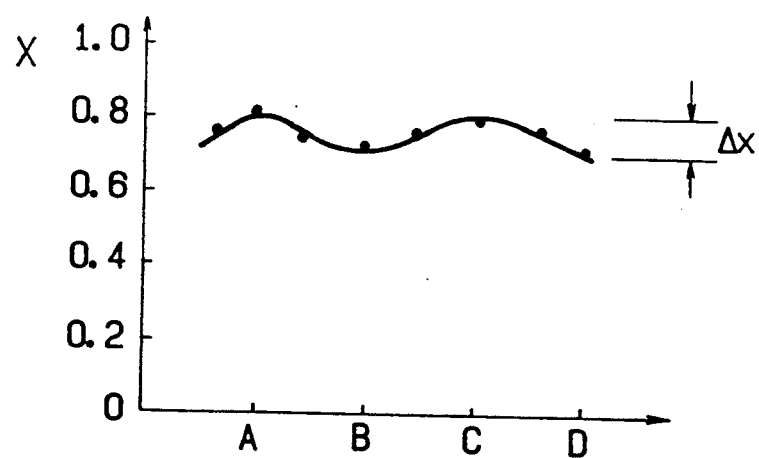
FIG. 12 is a graph of the distribution of the ratio of components, of the deposited film formed by the apparatus for forming the deposited film shown in FIG. 11, corresponding to the position of the gas introduction port shown in FIG. 2.

For instance, in a case where $SiH_4$ diluted with $H_2$ to 10% (hereinafter referred to as $SiH_4/H_2$) and $GeH_4$ diluted with $H_2$ to 5% (hereinafter referred to as $GeH_4/H_2$) are separately activated by applying RF waves, to deposit hydrogenated amorphous SiGe (hereinafter simply referred to as a-SiGe:H), unevenness occurs in the film composition of a-SiGe:H depending upon the ratio a:b:c. FIG. 12 illustrates the unevenness of the ratio of components in the deposited film in a case where active species of $Si_4$ are introduced from the gas introduction ports 201 and 203 and the active species of $GeH_4$ are introduced from the gas introduction ports 202 and 204. The abscissa indicates the position along the shorter axis of the gas introduction port, in which A, B, C, D correspond to the positions of the gas introduction ports 201-204 shown in FIG. 2. The ordinate indicates the ratio x of components in a-$Si_x$Gex:H.

The unevenness in the film composition is shown here as the variation change $\Delta x$ for x (in which x is determined by X-ray microanalyzer measurement).

Figure 13:
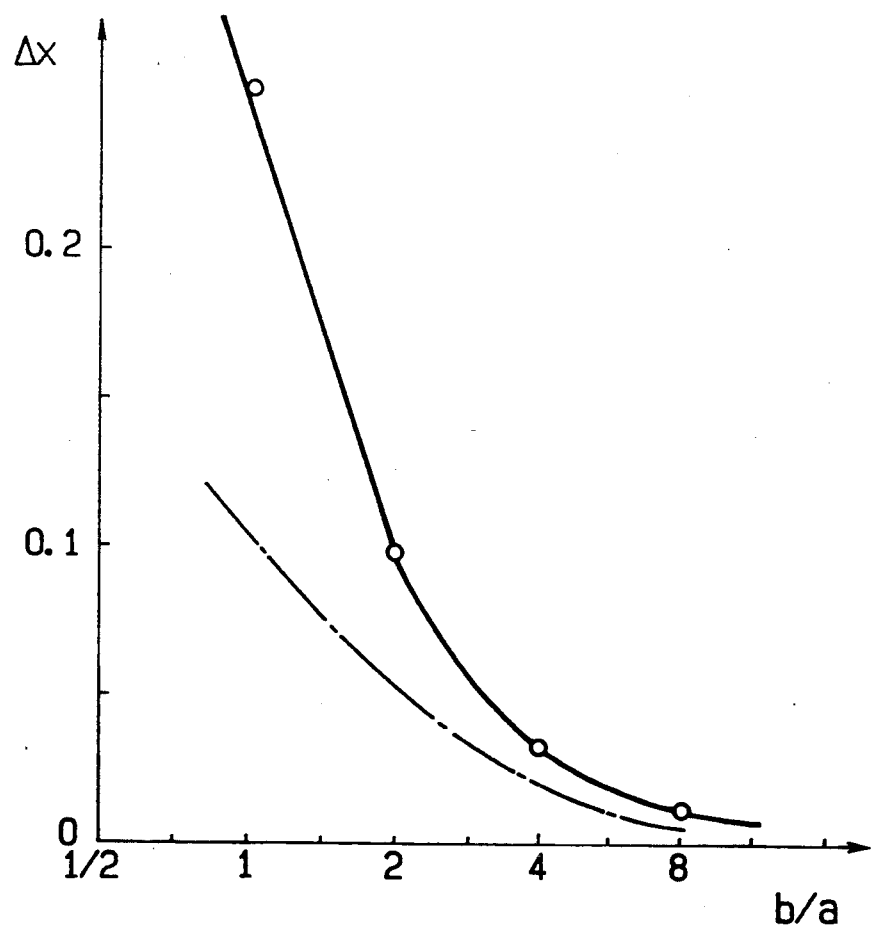
FIG. 13 is a graph illustrating a relationship between the variation range for the ratio of components in the deposited film formed by the apparatus for forming the deposited film shown in FIG. 11 and the shape of the gas introduction port.
Figure 14:
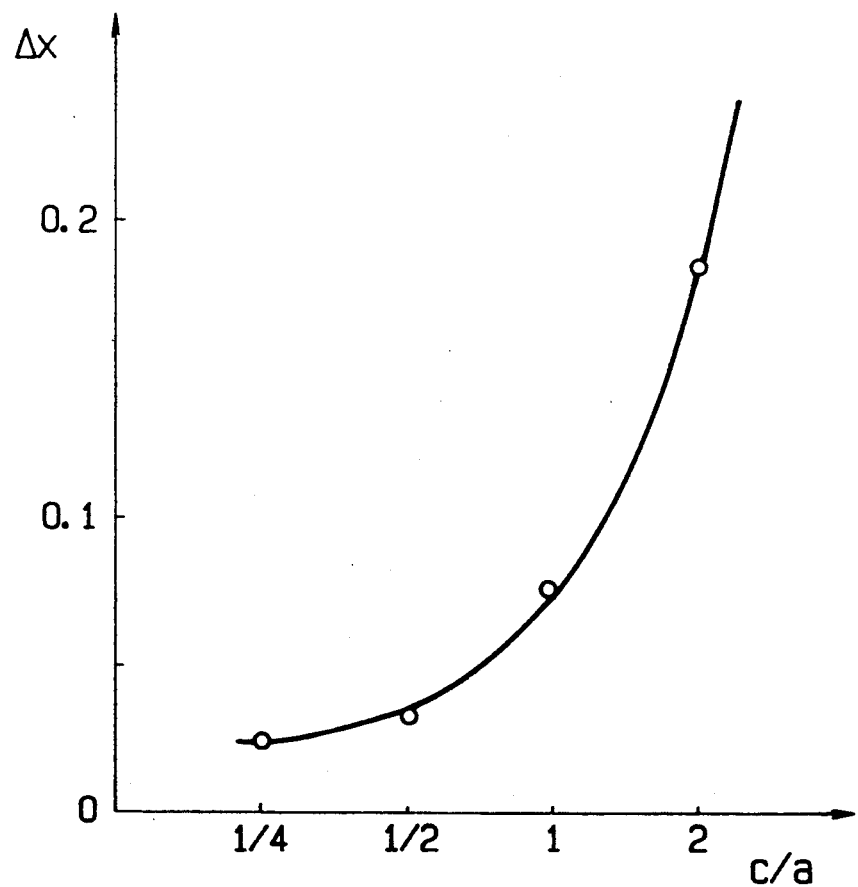
FIG. 14 is a graph illustrating a relationship between the variation range for the ratio of components in the deposited film formed by the apparatus for forming the deposited film shown in FIG. 11 and the arrangement of the gas introduction port.

In an apparatus in which b/a and c/a are changed respectively, the variation range $\Delta x$ for the ratio x of components, when the a-SiGe:H films of the same composition are formed, is shown in FIGS. 13 and 14. As seen from FIGS. 13 and 14, it has been noted that the scattering $\Delta x$ for the ratio x of components in $Si_xG_{1-x}$, film along the shorter axis is greatly reduced by setting the ratio b/a. That is, setting the longer-axis-to-shorter-axis ratio to greater than 2 and setting the distance between each of the introduction ports to the length of the shorter axis (c/a) to less than 1. When b/a was varied in FIG. 13, the longer axis was made constant at 8 cm and the length of the shorter axis was changed. Further, upon varying b/a, the ratio c/a was set to $\frac{1}{2}$. Further, upon varying c/a, a was fixed to 2 cm and b was fixed to 8 cm. Both of the flow rates for $SiH_4/H_2$ and $GeH_4/H_2$ were set to 800 sccm respectively, where a=8 and b=8 cm, and if a was varied, the flow rates were varied in proportion with the change of a. The inner pressure of the film-forming chamber was 0.4 Torr, the RF power applied was 80 mW/cm² on the side of $SiH_4/H_2$ and 30 mW/cm² on the side of $GeH_4/H_2$. Further, the distance between the gas introduction port and the substrate was set to 8 cm. If the distance between the gas introduction port and the substrate is made, for example, as large as 16 cm, the scattering $\Delta x$ of the ratio of components can be decreased as shown by the dotted chain in the graph of FIG. 14. However, since the deposition rate is reduced to less than $\frac{1}{4}$ as compared with the case where the distance is set to 8 cm, it is not practical to improve the homogeneity of the deposited film by increasing the distance between the gas introduction port and the substrate.

The above-mentioned example shows the relationship between the shape and the arrangement of the gas introduction ports and the homogeneity of the deposited film in a case where a-SiGe:H film is deposited by activating $SiH_4/H_2$ and $GeH_4/H_2$ separately and then mixing the thus activated gases and reacting them. Also in the case of forming a deposited film of another composition such as a a-SiC:H film or a deposited film of a single component, similar effects to those in the foregoing example can be obtained in any of the cases where a plurality of gases are activated separately.

That is, the ratio of the longer axis-to-shorter axis of a rectangular or elliptic gas introduction port is, preferably, not less than 2, more preferably, not less than 4 and, most suitably, not less than 8. Further, the ratio of the distance between each of the gas introduction ports to the length of the shorter axis is, preferably, not less than ½ and, most suitably, not greater than ¼.

It is possible to greatly improve the homogeneity of the deposited film by disposing the gas introduction ports having that shape in such an arrangement. The region for forming the deposited film can be increased to a desired area by setting the length of the gas introduction port in the direction of the longer axis. Further, the region for forming the deposited film can be increased to a desired area by increasing the number of the introduction ports disposed in parallel along the direction of the shorter axis. Accordingly, it is possible to form a deposited film uniformly over a desired area while separately activating a plurality of film-forming gases.

Further, it is possible to continuously form a deposited film over an even greater area in the direction of the shorter axis by moving the substrate along the shorter axis in an apparatus for forming a deposited film to be detailed later and shown in FIG. 24. Furthermore, the homogeneity of the film quality along the direction of the shorter axis can also be improved further by moving the substrate.

Further, in the apparatus for forming the deposited film according to the present invention, the gas introduction ports having the shape and the arrangement described above can easily be disposed by transporting the activated film-forming gases in the direction perpendicular to the RF electric field applied between the plate-like electrodes, that is, in the direction parallel with the plane of the electrodes in the case of the parallel and flat electrodes. In this case, the end face of the electrode may be utilized as the gas introduction port or, as shown in FIG. 11, a restriction member of a shape with further reduced shorter axis length may be attached to the end face of the electrode. Further, the activating efficiency for the film-forming gases relative to the electric power charged can be improved by transporting the activated gas in the direction vertical to the RF electric field applied between the plate-like electrodes.

Accordingly, in the apparatus for forming a deposited film according to the present invention, in which a plurality of film-forming gases are activated respectively into plasmas between each of the separate plate electrodes by the application of a plurality of film-forming gases, the respective activated film-forming gases are transported in the direction vertical to the RF electric field applied, introduced from a plurality of gas introduction ports each having a rectangular or elliptic shape with the length of the longer axis being more than twice that of the shorter axis, arranged in parallel with each other at a distance shorter than the length of the shorter axis into a film-forming space, mixed and reacted with each other to form a deposited film on a substrate. It is possible to control the activation ratio for a plurality of film-forming gases independently. It is possible to form a uniform deposited film over a large area while maintaining the advantage of controlling the film quality or the ratio of the components of the deposited film over a wide range and in a delicate manner without deteriorating the film quality. This is accomplished by independently activating a plurality of film-forming gases and controlling the activation ratio for a plurality of the film-forming gases.

The plurality of the film-forming gases used in the apparatus for forming the deposited film according to the present invention comprises two or more kinds of gases, each of which may be a gas mixture as the film-forming gases described previously. Further, the present invention is not restricted by the kind of film-forming gases.

Further, plate electrodes may not be in parallel with each other.

Additionally, the electrode to which high frequency is applied, may be grounded on one side as shown in FIG. 11 and electrodes for each of the sets may be separated by means of insulators such as $SiO_2$ and $Al_2O_3$. Alternatively, RF electric field may be applied to the central electrode plate and the periphery thereof may be partitioned with a grounded electrode plate as in the embodiment shown in FIG. 3.

The material used for the electrode is SUS, Al, etc. depending upon the type of film-forming gases. Further, Ni may be plated to the surface, if necessary.

Further, if the gas introduction port is restricted from the end face of the electrode as shown in FIG. 11, the material for the restricted portion may be made of the same material as that for the electrode plate or insulators such as teflon.

EXAMPLE

The present invention is to be described more specifically referring to examples, but the invention is not restricted only thereto.

EXAMPLE 1

Figure 15:
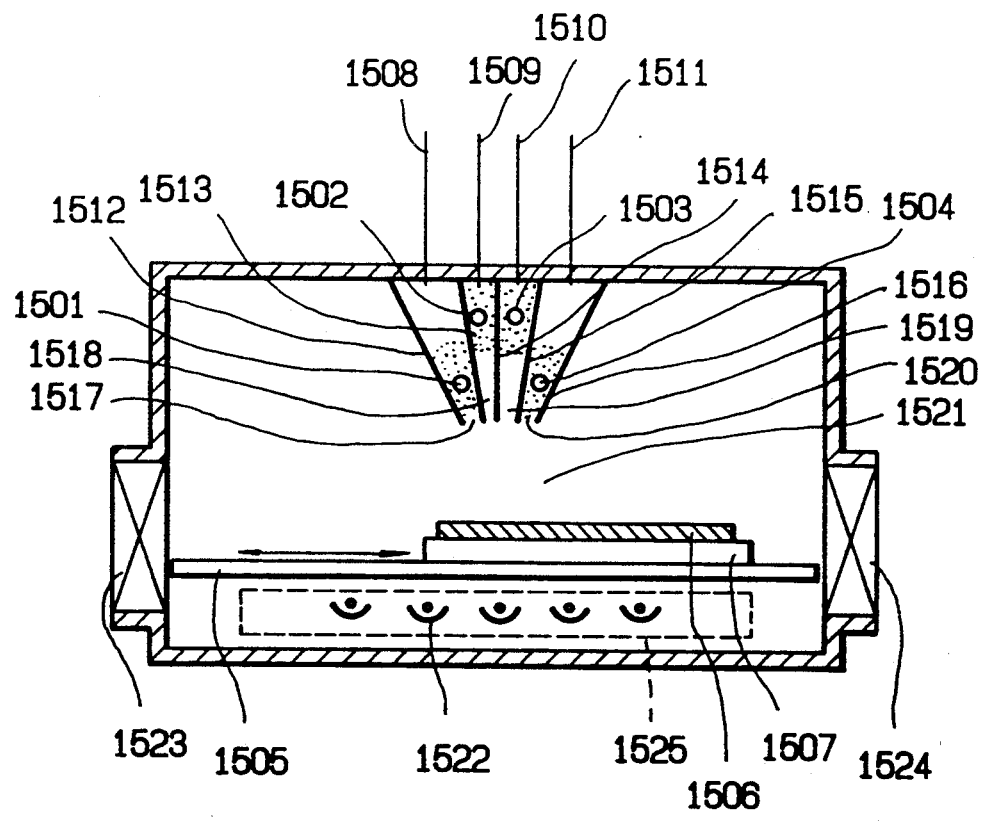
FIG. 15 is a cross sectional view of one embodiment of an apparatus for forming a deposited film according to the first aspect of the present invention viewed along a short axis.
Figure 16:
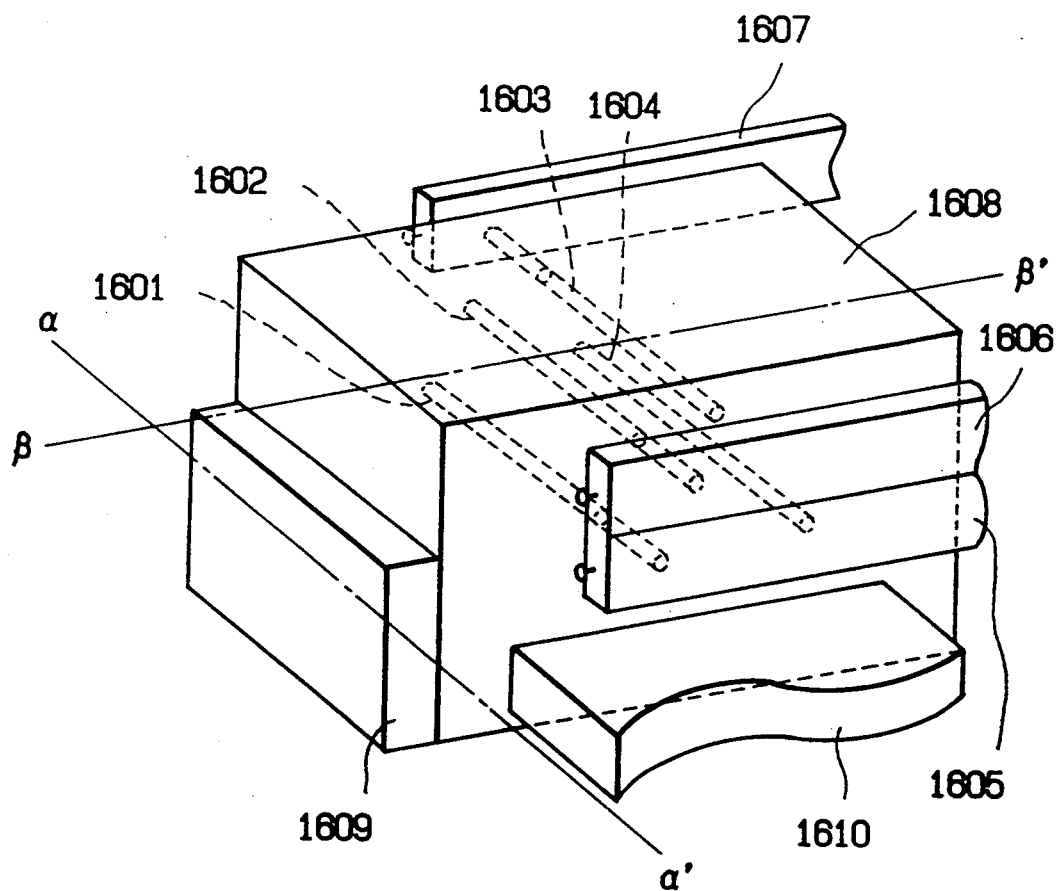
FIG. 16 is an explanatory view of the inside of the apparatus for forming the deposited film shown in FIG. 15.

FIGS. 15 and 16 show one embodiment of an apparatus for forming a deposited film according to the first aspect of the present invention.

In FIG. 15, reference numerals 1501–1504 denote rod antennas for transmitting microwaves, which correspond to the components 1601–1604 in FIG. 16. In FIG. 16, the microwave is transmitted from wave guides 1605–1607 to the rod antennas 1601–1604, each being 32 cm in length, to generate plasmas around the rod antennas, as shown in FIG. 15, to activate film-forming gases. Another feature of the apparatus shown in FIG. 16 is that a deposited film can be formed over a large area not only in the direction of a longer axis ($\alpha$–$\alpha'$) but also in the direction of the shorter axis ($\beta$–$\beta'$) by moving the substrate 1507 reciprocally in the direction of the arrows by a substrate transportation mechanism 1505.

The following is an example of forming an amorphous silicon carbide film (hereinafter simply referred to as a-SiC:H film) by using the apparatus for forming the depositing film shown in FIGS. 15, 16. $H_2$ at 150 sccm and Ar at 300 sccm were introduced through gas introduction pipes 1508 and 1511 respectively, while microwave of 400 W at 2.45 GHz was transmitted from a waveguide 1605 to the rod antennas 1501–1504 respectively to cause plasmas in the space partitioned with partition plates 1512, 1513 and 1515, 1516, thereby forming active Species of hydrogen (hereinafter simply referred to as H*). At the same time, $CH_4$ at 100 sccm was introduced from a gas introduction pipe 1509, while microwaves of 200 W were transmitted from a waveguide 1616 to the rod antennas 1502 to cause plasmas in the space between the partition plates 1513 and 1514, thereby forming active species of $CH_4$. At the same time, $SiF_4$ at 150 sccm and Ar at 200 sccm were introduced from a gas introduction pipe 1510, while microwaves of 400 W were transmitted from a waveguide 1607 to the rod antenna 1503 thereby causing plasmas in the space between the partition plates 1514 and 1515, thereby forming active species of $SiF_4$.

Then, H* from rectangular gas introduction ports 1517 and 1520 each being 2 cm × 35 cm, active species of CH₄ from a gas introduction port 1518 of 1 cm × 35 cm and active species of SiF₄ from a gas introduction port 1519 of 1.5 cm × 35 cm size, were respectively introduced, into a film-forming space 1521. They were mixed and reacted at an inner pressure of 8 mm Torr to deposit an a-SiC:H film to a glass substrate 1506 of 30 cm × 30 cm size heated to 270° C. by an IR lamp 1522. The substrate 1506 was reciprocated by the transportation mechanism 1505 at a speed of 5 cm/sec in the direction of $\beta$-$\beta'$ in FIG. 16.

Results of the evaluation of the film properties showed film thickness of 1.4 μm and the deposition rate of 23.2 Å/sec., $\nu_p = 1.6 \times 10^{-5} \Omega^{-1} cm^{-1}$, $\sigma_d = 7.8 \times 10^{-12} \Omega^{-1} cm^{-1} cm^{-1}$ and Egopt=2.0 eV. Regarding the variations of the respective properties within the plane of the substrate, both film thickness log $\sigma_p$ and log $\sigma_d$ were within ±10% and Egopt was within ±2%. As described above, an a-SiC:H film of good quality could be deposited uniformly over a large area by using the apparatus for forming the deposited film according to the present invention. Further, since the amount of H*, active species of SiF₄ and active species of CH₄ formed can be respectively and independently controlled, it is possible to deposit a film of a desired optical band gap while varying the ratio of component in the a-SiC:H film at a desired deposition rate without deteriorating the film quality.

In this example, the region for forming the deposited film can be enlarged both in the direction of the longer axis ($\alpha$-$\alpha'$) and in the direction of the shorter axis ($\beta$-$\beta'$) by reciprocally moving the substrate in the direction of the shorter axis ($\beta$-$\beta'$). The length of the substrate in the direction of the longer axis ($\alpha$-$\alpha'$) is determined depending upon the length of the rod antenna for transmitting the microwave, whereas the length of the substrate in the direction of the shorter axis ($\beta$-$\beta'$) is determined by the displacing distance upon reciprocal movement. Since both of these lengths can be changed as required, it is possible to obtain a region forming a deposited film over a large area both in the direction of the longer axis ($\alpha$-$\alpha'$) and the direction of the shorter axis ($\beta$-$\beta'$).

Further, although this embodiment is mentioned in connection with forming an a-SiC:H film' deposited films of other compositions can also be formed.

Furthermore, the number of the rod antennas for transmitting the microwave is not limited to that used in this example and a greater number of rod antennas may be used.

EXAMPLE 2

Figure 17:
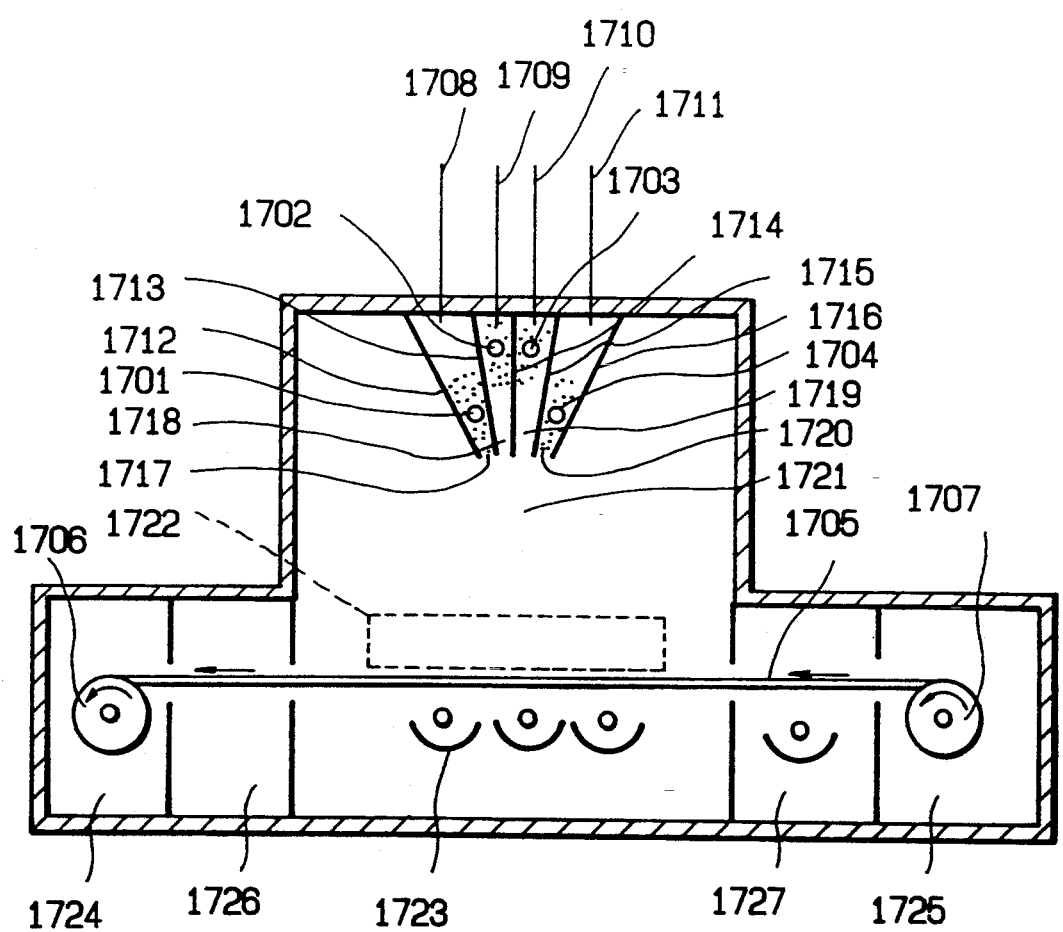
FIG. 17 is a cross sectional view, taken along the shorter axis, for another embodiment of an apparatus for forming a deposited film according to the first aspect of the present invention.

FIG. 17 shows one embodiment of another apparatus for forming a deposited film according to the first aspect of the present invention. The method of generating plasmas by the microwave in FIG. 17 is identical with that shown in FIGS. 15 and 16. The feature of this example resides in that a deposited film can be formed continuously over a large area in the direction of the shorter axis ($\beta$-$\beta'$) in FIG. 16 by winding, around a roll, a substrate 1705 being capable of bending and being delivered continuously from a roll 1707, forming a deposited film and taking the film up a roll 1706

Since the area can be increased in the direction of the longer axis ($\alpha$-$\alpha'$) by extending the length of the rod-like microwave antenna, a deposited film can be formed continuously over a large area in a region with a desired width and a desired length.

The following is an example of forming an amorphous germanium film (hereinafter simply referred to as a-SiGe:H film) by using the apparatus for forming the deposited film shown in FIG. 17. H₂ at 150 sccm and Ar at 400 sccm were introduced from gas introduction pipes 1708 and 1711 respectively, while microwaves of 400 W at 2.45 GHz were transmitted from a waveguide 1605 to rod antennas 1501 and 1504 respectively to cause plasmas in a space partitioned with partition plates 1710, 1713 and 1715, 1716, to form H*. At the same time, GeF₄ diluted with Ar to 10% was introduced at 300 sccm from the gas introduction port 1709, while microwaves of 150 W were transmitted through a waveguide 1606 to an antenna 1702 to generate plasmas in a space between the partition plates 1713 and 1714, to form active species of GeF₄. At the same time, SiF₄ at 200 sccm and Ar at 200 sccm were introduced from a gas introduction pipe 1710, while microwaves of 300 W were transmitted from a waveguide 1607 to an antenna 1703 to cause plasmas in a space between partition plates 1714 and 1715, to form active species of SiF₄. Then, H* from rectangular introduction ports 1717, 1720 each being 3 cm × 35 cm, active species of GeF₄ from a gas introduction port 1718 of 1 cm × 35 cm and active species of SiF₄ from a gas introduction port 1719 being 1.5 cm × 35 cm were introduced respectively into a film-forming space 1721. They were mixed and reacted with each other at an inner pressure of 50 mm Torr to deposit an a-SiGe:H film while moving a stainless steel substrate 1705 of 30 cm in width heated to 240° C. by an IR lamp 1723 at a speed of 5 cm/min.

In this example, aluminum or heat resistant polyester or polyimide may be used in addition to the material described above so as to obtain the substrate 105 that can be bent. The result of depositing the a-SiGe:H film on the glass substrate heated to 240° C. under the previously mentioned conditions and evaluation of the film properties are shown in Table 1, No. 2. Other data show the result in a case where the flow rate for GeF₄ and the electric power of the microwave for activating GeF₄ were varied.

Table 1 shows an example of preparing films of different optical band gaps (Egopt) by varying the composition for a-SiGe:H films by independently controlling the activation amount of GeF₄. A gas mixture of SiF₄ and GeF₄ was decomposed by plasmas. When an a-SiGe:H film of small Egopt is to be prepared by a conventional method of forming a deposited film, experience has shown that the light conductivity ($\sigma_p$) is reduced and the dark conductivity ($\sigma_d$) is increased, often deteriorating the film quality. However, in the apparatus of the present invention, since the activation of GeF₄ can be independently controlled, films of satisfactory quality, including SiGe films of small Egopt, can be easily obtained.

Further, deposited films can be formed with substantially identical Egopt and with different deposition rates by simultaneously varying the yield of H* and the yield of active species of SiF₄ together with the yield of active species of GeF₄.

In this embodiment, the distribution of the deposition rate of the a-SiGe:H film deposited on the substrate was within 3%, the distribution of the ratio x of components in $Si_xGe_{1-x}$ was within 2% and the distribution of the electroconductivity $\sigma$ was within 50%. That is, an a-SiGe:H film could be uniformly deposited with 30 cm width over a desired length.

As has been described above, a SiGe films could be formed uniformly over a large area by the apparatus for forming the deposited film shown in FIG. 17. Further, a-SiGe:H films of good quality having desired band gaps could easily be formed at a desired deposition rate by controlling the yields of the active species of SiF$_4$ and the active species of GeF$_4$ independently.

Although the formation of a-SiGe:H films is shown in this example, other deposited films comprising a plurality of compositions can also be formed by varying the species of gases.

EXAMPLE 3

Deposition of phosphorus doped-amorphous silicon film (hereinafter simply referred to as P doped a-Si:H film) using the apparatus shown in FIG. 17 and used in Example 2 is to be explained below.

H$_2$ was introduced from gas introduction pipes 1708 and 1711 at 300 sccm, while microwaves of 400 W at 2.45 GHz were transmitted from waveguide 1605 to antennas 1701–1704 respectively, generating plasmas in a space partitioned with the partition plates 1712, 1713 and 1715, 1716, thereby forming H*. Simultaneously, SiH$_4$ was introduced at 300 sccm from the gas introduction port 1710, while microwaves of 300W were transmitted from the waveguide 1605 to antennas 1703 to generate plasmas in a space between the partition plates 1714 and 1715, thereby forming active species of SiH$_4$. Simultaneously, PH$_3$ diluted with He to 2500 ppm was introduced from the gas introduction pipe 1709, while microwaves of 150 W were transmitted from waveguide 1606 to the antenna 1702 to form plasmas in a space between the partition plates 1713 and 1714, thereby forming active species of PH$_3$.

H*, active species of SiH$_4$ and active species of PH$_3$ thus formed were introduced from the rectangular gas introduction ports 1717–1720 into the film-forming space 1721. They were mixed and reacted at an inner pressure of 14 mm Torr and a P doped a-Si:H film was deposited by moving the stainless substrate 1705 heated to 340° C. by the IR lamp 1723 at a speed of 5 cm/min.

A P doped a-Si:H film was deposited on the glass substrate heated to 240° C. under substantially identical conditions to those described above and when the film properties were evaluated, the results showed that the film thickness was on average 1.6 μm, the deposition rate was on average 17.8 Å/sec, $\sigma_p=4.4\times10^{-2}\Omega^{-1}cm^{-1}$, $\sigma_d=4.3\times10^{-2}\Omega^{-1}cm^{-1}$, activation energy E=0.08n eV and Egopt=1/76 eV. Regarding the distribution of each of the properties in the plane of the substrate, the film thickness was ±5%, both $\sigma_p$ and $\sigma_d$ were ±15% and the homogeneity was satisfactory.

As has been described above, uniform and satisfactory P doped a-Si:H film could be deposited over a large area by using the apparatus for forming the deposited film shown in FIG. 17.

Further, since the yield of the active species of SiH$_4$ and the yield of the active species of PH$_3$ could be independently controlled, phosphorus concentration in the P doped a-Si:H film could be controlled with good reproducibility as desired.

Further, since the yields of H* and the active species of SiH$_4$ could be independently controlled, the film quality could be controlled with ease as desired from amorphous silicon film to microcrystal silicon film. The deposition rate could also be controlled as desired without deteriorating the film quality. Although P doped a-Si:H film was described in this example, it is of course possible to form deposited films of other compositions such as boron-doped P type amorphous silicon films.

In addition, although deposited film doped with alloy or impurity has been explained in this example, it is of course possible to also form a deposited film of single component such as amorphous silicon over a large area, with ease and with good homogeneity.

In the apparatus for forming the deposited film according to the first aspect of the present invention, it is possible to form a deposited film of homogenous film quality over a large area by activating a plurality of film-forming starting material gases independently. This is accomplished by generating electric discharge and thereby activating a plurality of film-forming starting material gases respectively each at the periphery of the rod antenna to which microwaves had been applied. The activated film-forming starting material gases are transported perpendicular to the direction of the longer axis of the rod antenna; introducing them from a plurality of gas introduction ports, each having a rectangular or elliptic shape with the length of the longer axis being more than twice that of the shorter axis and disposed in parallel with each other at a distance less than the length of the shorter axis into a film-forming space, mixing them and causing the activated film-forming starting material gases to react with each other.

That is, a deposited film of a homogenous film quality can be formed over a large area at a reduced cost by employing the means of controlling the ratio of the components and thereby, the film quality of the deposited film formed. Where the deposited film comprises a plurality of components, increasing the selectivity of the starting material gases and extending the range for the film-forming conditions is made possible by independently activating a plurality of film-forming starting material gases, thereby controlling the activation ratio for each of the film-forming starting material gases and controlling the yield and the reaction of the respective active species. The microwaves are transmitted to a plurality of rod antennas activating film forming starting material gases around each of the rod antennas. Thus, film forming starting material gases are uniformly activated over a wide range by charging great electric power. The respective activated film-forming starting material gases were introduced into the film-forming space from a plurality of gas introduction ports each of a rectangular or elliptic shape with the length of the longer axis being more than twice that of the shorter axis and disposed in parallel with each other at a distance less than the length of the shorter axis; mixing the activated film forming starting gases which then react with each other.

Further, by moving the substrate along the direction of the shorter axis, it is possible to form a deposited film of uniform film quality with a large width and a desired length.

EXAMPLE 4

Figure 18:
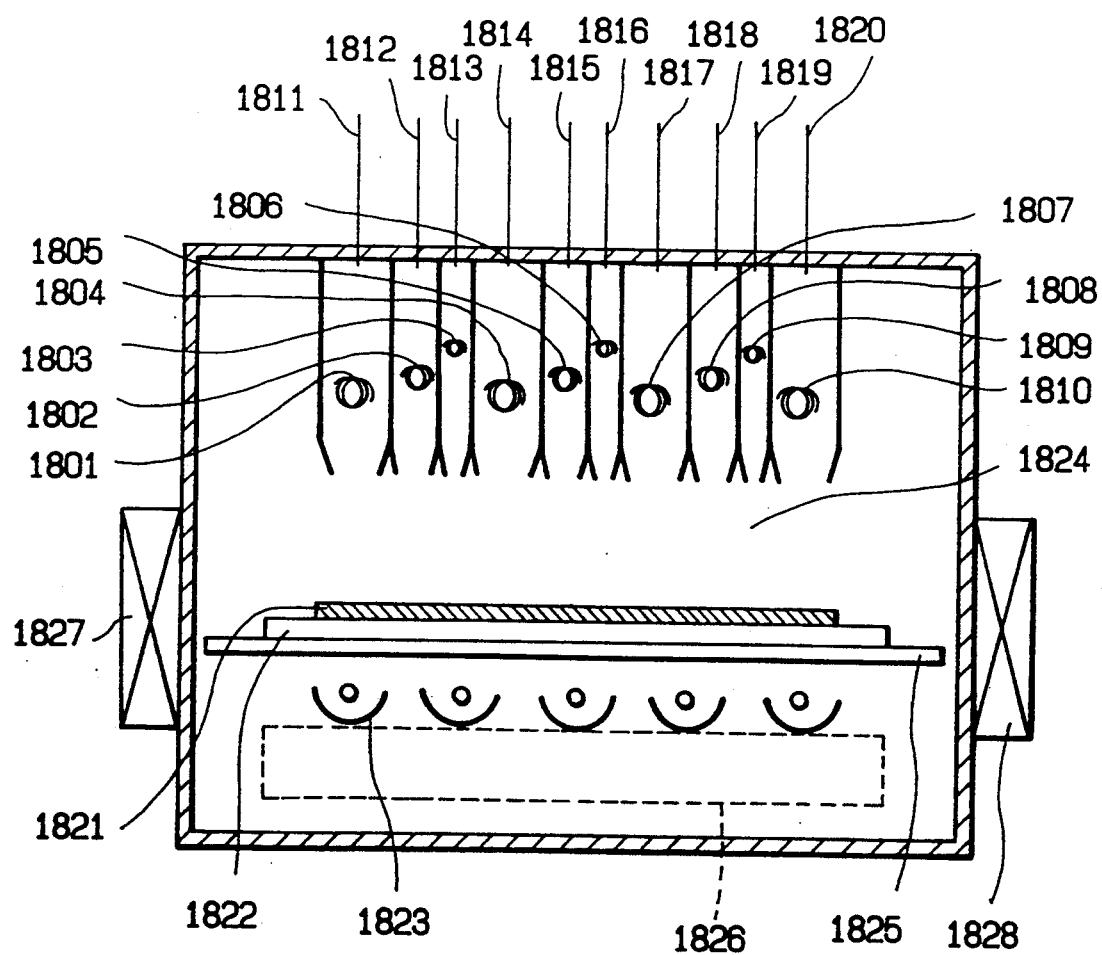
FIG. 18 is a cross sectional view, taken along the shorter axis, for one embodiment of an apparatus for forming a deposited film according to the second aspect of the present invention.
Figure 19:
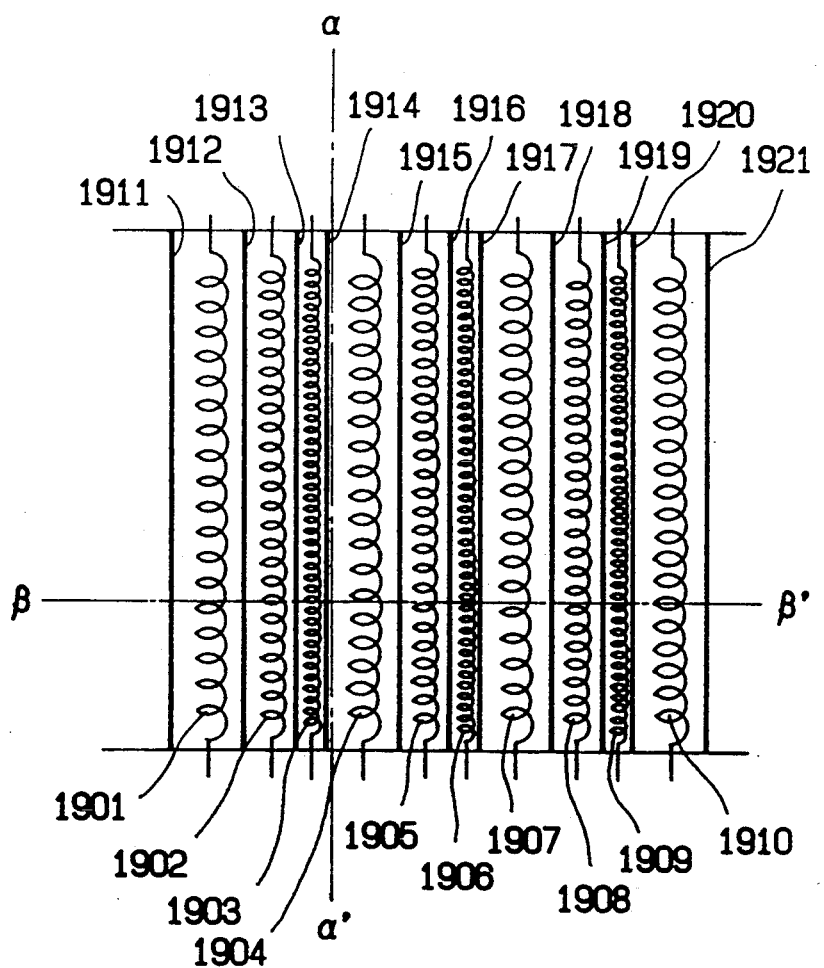
FIG. 19 is an explanatory view, as viewed from above, for the inside of the apparatus for forming the deposited film shown in FIG. 18.

FIGS. 18 and 19 show one example of an apparatus for forming a deposited film according to the second aspect of the present invention. FIG. 18 is a cross sectional view of the apparatus for forming a deposited film and FIG. 19 is a view of the portion of the filament in FIG. 18 of the above. A plurality of film-forming starting material gases are activated by respective filaments. The respective filaments are partitioned with partition plates made of stainless steel or molybdenum so that the film-forming starting material gases may not be mixed with each other. Further in this example, the region for forming the deposited film can be enlarged in the direction of both the longer axis ($\alpha$–$\alpha'$) and the shorter axis ($\beta$–$\beta'$) by arranging a number of rectangular gas discharge ports elongated in the direction of the longer axis ($\alpha$–$\alpha'$) and in the direction of the shorter axis ($\beta$–$\beta'$).

The following example shows deposition of a phosphorus doped n type amorphous silicon film (hereinafter simply referred to as P-doped a-Si:H film) by using the apparatus for forming the deposited film shown in FIGS. 18 and 19.

$H_2$ was introduced at 200 sccm from gas introduction ports 1811, 1814, 1817 and 1820. Filaments 1801, 1804, 1807, 1810, each being 20 cm in length, winding diameter of 10 mm and number of turns of 4 T/cm were heated respectively to 1800° C., to form active species of $H_2$. Simultaneously, $SiH_4$ diluted with He to 20%, was introduced at 150 sccm from each of gas introduction pipes 1812, 1815 and 1818, while filaments 1802, 1805, 1808 each of 20 cm length, winding diameter of 7 mm and number of turns of 5 T/cm were heated to 1600° C., to form active species of $SiH_4$. $PH_3$ diluted with He to 2000 ppm was introduced at 80 sccm from each of gas introduction pipes 1813, 1816 and 1819, while filaments 1803, 1806 and 1809 each 20 cm in length, winding diameter of 5 mm and number of turns of 8 T/cm were heated to 1600° C. to form active species of $PH_3$.

Then, active species of $H_2$ from a gas introduction port of 2 cm $\times$ 20 cm partitioned by partition plates, active species of $SiH_4$ from a gas introduction port of 1.5 cm $\times$ 20 cm and active species of $PH_3$ from a gas introduction port of 1 cm $\times$ 20 cm were introduced respectively into film-forming space 1824, where they were mixed at an inner pressure of 0.7 Torr in order to react each of the active species, thereby depositing a P-doped a-Si:H film on substrate 1821 of 20 cm $\times$ 10 cm size and heated by an IR lamp 1823 to 280° C.

When a glass substrate was used and the properties of the P-doped a-Si:H film were evaluated, the film thickness was 0.8 $\mu$m, the deposition rate was 0.4 Å/sec, $\sigma_p = 4.8 \times 10^{-1} \Omega^{-1} cm^{-1}$, $\sigma = 4.7 \times 10^{-1} \Omega^{-1} cm^{-1}$, activation energy $\Delta E = 0.08$ eV and Egopt = 1.75 eV. Further, the distribution of each of the properties within the plane of the substrate showed the film thickness to be within $\pm 2\%$ and $\sigma_p$ and $\sigma_d$ to be within $\pm 5\%$; thus, the homogeneity was satisfactory.

As described above, a P-doped a-Si:H film of homogenous and good quality could be deposited over a large area by using the apparatus for forming the deposited film as shown in FIGS. 18 and 19. Further, since the yield of the active species of $SiH_4$ and the yield of the active species of $PH_4$ could be independently controlled, concentration of phosphorus in the P-doped a-Si:H film could be controlled as desired with good reproducibility.

Further, since the yields of the active species of $H_2$ and $SiH_4$ could be independently controlled, the film quality could be easily controlled as desired. This was so for both amorphous silicon film and microcrystal silicon film. The deposition rate could also be controlled as desired without deteriorating the film quality. In this case, although P-doped a-Si:H film is mentioned as an example, it is also possible to form deposited films of other compositions such as boron doped p type amorphous silicon film or alloy series amorphous silicon film.

EXAMPLE 5

Figure 20:
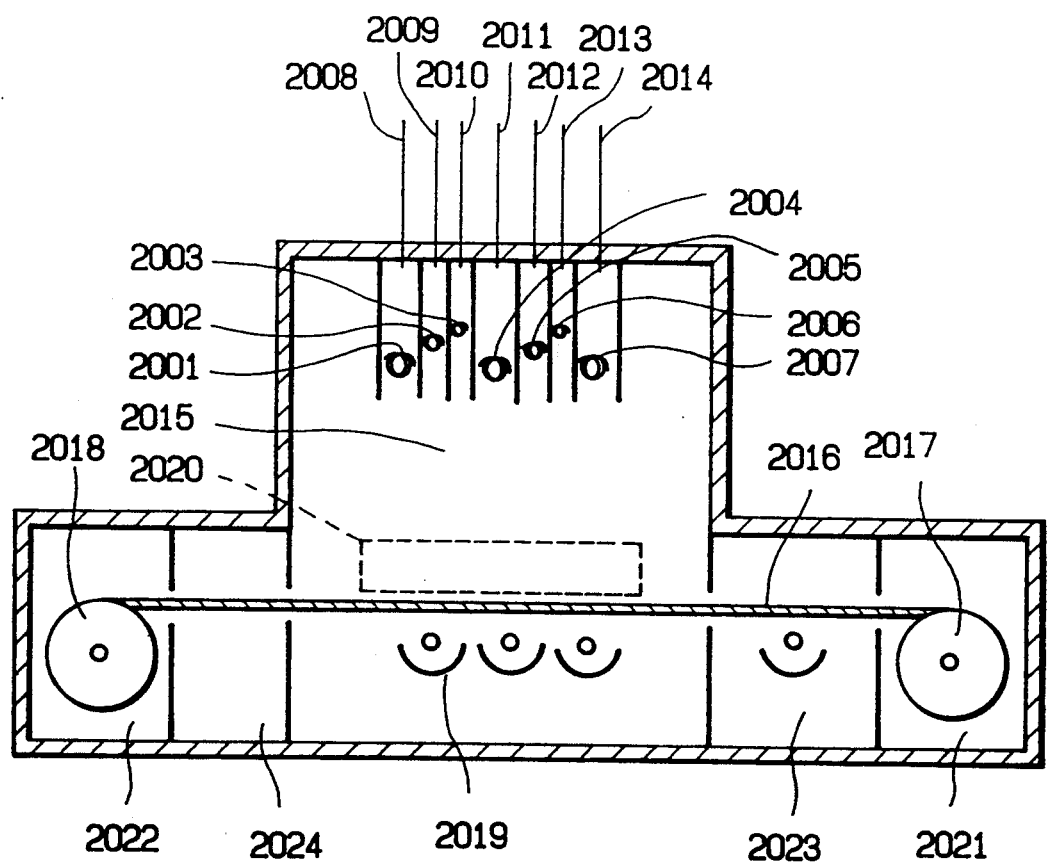
FIG. 20 is a cross sectional view, taken along the shorter axis. for another embodiment of the second aspect of the present invention.
Figure 25:
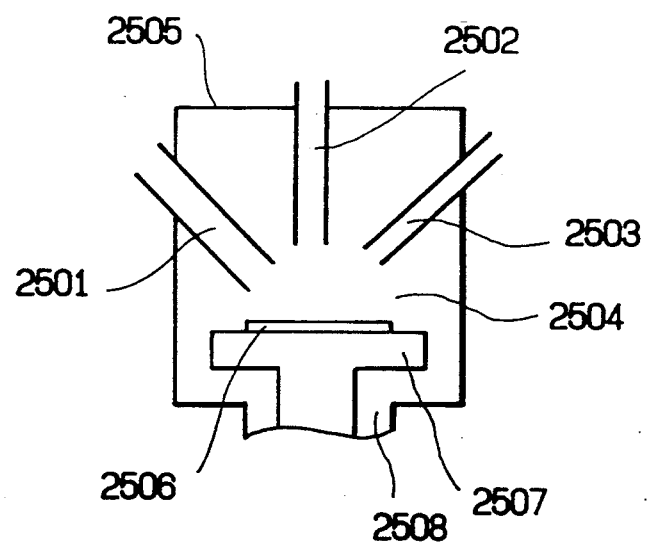
FIG. 25 is a schematic view of one embodiment of a conventional apparatus for forming a deposited film.

FIG. 20 shows another embodiment of an apparatus for forming a deposited film according to the second feature of the present invention. Reference numerals 2001–2007 denote filaments and the method of exciting the film-forming starting material is identical to that in Example 4. The apparatus for forming the deposited film shown in FIG. 20 features a substrate 2005 capable of being bent. The substrate is wound into a roll, and continuously delivered from the roll 2017 forming a deposited film which is then taken up into a roll 2018. Thus, a deposited film can be formed continuously over a large area in the direction of the shorter axis ($\beta$–$\beta'$) as in FIG. 19. Further, since a desired deposited film-forming region can be obtained in the direction of the longer axis ($\alpha$–$\alpha'$) in FIG. 19, by varying the length of a filament, it is possible to continuously form a deposited film over a region of large area of desired width and desired length.

An example of depositing an amorphous silicon germanium film (hereinafter simply referred to as a a-SiGe:H film) by using an apparatus for forming a deposited film shown in FIG. 2 is described below.

$H_2$ was introduced at 250 sccm from each gas introduction pipe 2008, 2011 and 2014, while filaments 2001, 2004 and 2007 each of 20 cm length, winding diameter of 8 mm and number of turns of 5 T/cm were heated to 1800° C. to form active species of $H_2$. Simultaneously, $Si_2F_6$ was introduced at 200 sccm from each gas introduction pipe 2009 and 2012, while filaments 2002 and 2005 each of 20 cm length, 6 mm winding diameter and number of turns of 6 T/cm were heated to 1600° C., to form active species of $Si_2F_6$. At the same time, $GeF_4$ diluted with He to 5% was introduced at 100 sccm from each gas introduction pipe 2010 and 2013, while filaments 2003 and 2006 each of 20 cm length, 4 cm winding diameter and number of turns of 8 T/cm were heated to 1600° C., to form active species of $GeF_4$.

Active species of $H_2$ formed by the above-mentioned method were introduced from a rectangular gas introduction port of 2 cm $\times$ 20 cm partitioned with the partition plates into a film forming space 2015. Active species of $Si_2F_6$ and active species of $GeF_4$ were respectively introduced from separate gas introduction ports of 1 cm $\times$ 20 cm into the film-forming space 2015. Then they were mixed and reacted with each other at an inner pressure of 0.4 Torr and a-SiGe:H film was deposited on a stainless steel substrate 2016 heated to 250° C. by an IR lamp 519 while moving the substrate at a rate of 5 cm/min. For the formation of the substrate 2016 that can be bent, aluminum or heat resistant polyester or polyimide may be used in addition to the above-mentioned material. An a-SiGe:H film was deposited on a glass substrate of 20 cm $\times$ 20 cm heated to 250° C. without moving the roll, under the above-mentioned conditions, and the film properties were then evaluated. The results are shown in Table 2, No. 6. Additional data show the results obtained where the flow rate for $GeF_4$ and the temperature of the filament for activating $GeF_4$ were varied.

Table 2 shows an example of preparing films of different optical band gaps (Egopt) while varying the composition of the a-SiGe:H film by independently controlling the activation amount of $GeF_4$. In the conventional method of forming deposited films by decomposing a gas mixture of $Si_2F_6$ and $GeF_4$, is an a-SiGe:H film with low Egopt is to be prepared, experience has shown that the light conductivity ($\sigma_p$) was reduced and the dark conductivity ($\sigma_d$) was increased, often deteriorating the film quality. In contrast, in the apparatus according to the present invention, since the activation for $GeF_4$ could be independently controlled, films of satisfactory quality, including SiGe film of low Egopt, could be easily obtained.

Further, deposited films with substantially identical Egopt and of different deposition rates could be formed by varying the yield of active species of $H_2$ and the yield of active species of $Si_2F_6$ simultaneously with the yield of active species of $GeF_4$. For the deposited a-SiGe:H film, the distribution of the deposition rate on the substrate was within 3%, the distribution of the ratio x of components in $Si_xGe_{1-x}$ was within 2% and the distribution of the electroconductivity $\sigma$ was within 40%. That is, a uniform a-SiGe:H film could be deposited having 30 cm width over a desired length.

As described above, the a-SiGe:H film could be formed uniformly over a large area by the apparatus for forming the deposited film shown in FIG. 20. Further, a-SiGe:H films of good quality with the desired band gap could easily be formed at a desired deposition rate by controlling the yield of the active species of $Si_2F_6$ and the active species of $GeF_4$ independently.

Although this example describes the formation of the a-SiGe:H film, it is also possible to form other deposited films comprising a plurality of compositions of varying species of gases.

EXAMPLE 6

An example of depositing amorphous silicon carbide films (hereinafter simply referred to as a-SiC:H films) by using the apparatus for forming the deposited shown in FIG. 20 is described below.

$H_2$ was introduced at 250 sccm from each gas introduction pipe 2008, 2011 and 2014, while the filaments 2001, 2004 and 2007 were respectively heated to 1800° C. to form active species of $H_2$. Simultaneously, $Si_2F_6$ was introduced at 150 sccm from each gas introduction pipe 2009 and 2012, while the filaments 2002 and 2005 were heated to 1600° C., to form active species of $Si_2F_6$. Further, $CH_4$ was simultaneously introduced at 100 sccm from the gas introduction pipes 2010 and 2013, while the filaments 2003 and 2006 were heated to 1700° C., to form active species of $CH_4$.

The active species of $Hk_2$, the active species of $Si_2F_6$ and the active species of $CH_4$ formed by the above-mentioned method were introduced from the rectangular gas introduction ports partitioned with partition plates into the film-forming space 2015, where they were mixed at an inner pressure of 0.3 Torr, reacted with each other and a-SiC:H film was deposited on the stainless steel substrate 2016 heated to 280° C. by IR lamp 2019 while moving the substrate at a speed of 4 cm/min. Under the conditions described above, an a-SiC:H film was deposited on a glass substrate of 20 cm×20 cm heated to 280° C. without moving the roll and, as a result, the deposition rate was 8.9 Å/sec, Egopt=1.95 eV, $\sigma_p=1.8\times10^{-5}\Omega^{-1}cm^{-1}$ and $\sigma_d=8.3\times10^{-12}\Omega^{-1}cm^{-1}$. For the deposited a-SiC:H film, the distribution of the deposition rate on the substrate was within 3.5%, the distribution of the ratio x of components in $Si_xC_{1-x}$ was ±2% and the distribution of the electroconductivity $\sigma$ was 50%; a uniform a-SiC:H film could be formed with a width of 30 cm for a desired length.

As described above, a-SiC:H films of good quality could be deposited uniformly over a large area by using the apparatus for forming the deposited film in the second feature of the present invention. Furthermore, since the yields for the active species of $H_2$, active species of $Si_2F_6$ and active species of $CH_4$ can be independently controlled, a-SiC:H films of desired optical band gaps could be deposited at a desired deposition rate without deteriorating the film quality by varying the ratio of components in the a-SiC:H film.

In the foregoing example, the embodiment of impurity-doped deposition film or alloy type deposition film has been described. It is, of course, possible to form a deposited film of a single component over a large area by using the apparatus for forming the deposited film according to the present invention.

In the apparatus for forming the deposited film according to the second feature of the present invention, a plurality of film-forming starting material gases are activated separately and respectively with elongated heat-generating filaments. The thus activated respective film-forming starting material gases are transported in the direction perpendicular to the longitudinal axis of the filaments, and introduced into a film-forming space from a plurality of gas introduction ports. Each of the gas introduction ports is of a rectangular or elliptic shape with the length of the longer axis being more than twice that of the shorter axis and disposed in parallel with each other at a distance less than the length of the shorter axis. The activated film-forming starting material gases are then reacted with each other. Accordingly, it is possible to form a deposited film of a homogenous film quality over a large area while possessing the capability of activating a plurality of film-forming starting material gases independently.

That is, a deposited film of a homogenous film quality can be formed over a large area at a reduced cost while having the advantage of carefully controlling the ratio of the components and, thereby, the film quality of the deposited film formed where the deposited film comprises a plurality of components. This is accomplished by the following: increasing the selectivity of the starting material gases and extending the range for the film-forming conditions by activating a plurality of film-forming starting material gases independently; independently controlling the activation ratio for each of the film-forming starting material gases as well as controlling the yield and the reaction of the respective active species; transporting the film-forming starting material gases in the direction perpendicular to the longer axis of elongated filaments to form the active species uniformly in an elongated shape over a wide range; and by introducing respective activated film-forming starting material gases into the film-forming space from a plurality of gas introduction ports each of rectangular or elliptic form with the length of the longer axis being more than twice that of the shorter axis and disposed in parallel with each other at a distance less than the length for the shorter axis.

Further, it is possible to form a deposited film of a homogenous film quality with a large width, at a desired length over a large area by moving a substrate along the direction of the shorter axis.

EXAMPLE 7

FIGS. 21-23 are explanatory views for the basic embodiment of an apparatus for forming a deposited film according to the third aspect of the present invention, in which FIG. 21 is a cross sectional view of the apparatus for forming a deposited film according to the present invention. FIGS. 22 and 23 are explanatory views of the inside of the film-forming chamber shown in FIG. 21. FIG. 21 is a cross sectional view taken along line $\beta$-$\beta'$ in FIG. 22.

Reference numerals 2101-2107 denote respectively capacitance-coupled type RF electrodes, in which RF power is applied from RF power sources 2108-2110 to central electrodes 2101-2103 respectively and independently. Peripheral electrodes 2104-2107 are grounded to the earth. That is, three sets of capacitance coupled type electrodes are disposed. The electrodes 2101-2107 are insulated by insulator 2111 made of $Al_2O_3$. The insulator extends to the periphery between each of the electrodes except in the direction of the substrate as shown in FIG. 22. Film-forming gases introduced from gas introduction pipes 2112-2114 are independently activated between 3 sets of RF electrodes, and reacted with each other in a film-forming space 2115 to form a deposited film on a substrate 2116.

FIG. 22 is a structural view of the RF electrode and the substrate at the inside of a film-forming chamber 2117 and FIG. 23 is a view showing the relationship between gas introduction ports of three sets of RF electrodes and the substrate in FIG. 22 as viewed from above FIG. 21. The feature of the apparatus for forming the deposited film according to the present invention resides in: film-forming gases that are activated between 3 sets of RF electrodes independently; homogenous long deposited film of large area being formed along the direction $\alpha$-$\alpha'$ by introducing activated film-forming gases from gas introduction port 2301-2306 each of a rectangular cross section being 2 cm in length in the direction of the shorter axis ($\beta$-$\beta'$) and 35 cm length for the longer axis ($\alpha$-$\alpha'$) and disposed closely to each other as shown in FIG. 23.

In this apparatus, the distance between the gas introduction port and the substrate was 10 cm and the electrode was made of Ni-plated SUS. An example in which an amorphous silicon film (hereinafter simply referred to as a-Si film) is deposited by using the apparatus according to the present invention is described below.

$H_2$ at 200 sccm and Ar at 800 sccm were introduced respectively from the gas introduction pipes 2112 and 2114, while RF wave at 13.56 MHz was applied at 100 mW/cm$^2$ to the inner electrodes 2101 and 2103 by means of the RF frequency power sources 2108 and 2110 to form plasmas of a gas mixture of $H_2$ and Ar, and active species of hydrogen (hereinafter simply referred to as H*) from rectangular gas introduction ports 2301, 2203, 2304, and 2306 were introduced into a film-forming space 2115. At the same time, $SiF_4$ at 500 sccm and Ar at 200 sccm were introduced from the gas introduction pipe 2113, while RF were at 13.56 MHz was applied from an RF wave power source 2109 at 80 mW/cm to the inner electrode 2102 to generate plasmas of a gas mixture of $SiF_4$ and Ar, and the active species of $SiF_4$ was transported from rectangular gas introduction ports 2302 and 2305 to the film-forming space 2115. H* and the active species of $SiF_4$ were mixed and reacted in the film-forming space 2115 at an inner pressure of 0.4 Torr to deposit a hydrogenated amorphous silicon film (hereinafter simply referred to as a-SiC:H film) to an average thickness of 1.2 $\mu$m on a glass substrate 2116 heated to 250° C. by a heater 2119. The deposition rate was 7.0 Å/sec. Further, the distribution of the film thickness depending upon the position on the substrate 2116 averaged ±5%. An Al electrode was formed by vapor deposition to the deposited a-SiC:H film and, measurements for the light conductivity ($\sigma_p$) and dark conductivity ($\sigma_d$) were respectively: $\sigma_p = 3.3 \times 10^{-5} \Omega^{-1} cm^{-1}$ and $\sigma_d = 4.2 \times 10^{-11} \Omega^{-1} cm^{-1}$. The deviation of the conductivity depending upon the position was ±10% of the above-mentioned values, together with $\log \sigma_p$, $\log \sigma_d$.

The substrate 2116 used in this embodiment was 30 cm in the $\alpha$-$\alpha'$ direction and 10 cm in the direction of $\beta$-$\beta'$. By disposing gas introduction ports each with an elongated shape of 2 cm×35 cm adjacent to one another, it was possible to form an a-SiC:H film of good quality uniformly, as described above, over a large area.

The area of the substrate can be further increased, in particular, in the direction $\alpha$-$\alpha'$ by an increase in the area of the electrodes 2101-2107. Further, it is possible to easily control the film quality of the deposited silicon film as desired, including amorphous film and polycrystalline film, by controlling the H* and the active species of $SiF_4$ independently.

EXAMPLE 8

The following example shows the formation of a deposited film comprising a plurality of components, while taking advantage of the apparatus for forming the deposited film according to the third feature of the present invention that activation for a plurality of film-forming gases can be controlled independently.

FIG. 24 is a cross sectional view of an apparatus having fundamentally the same structure as that of the apparatus used in Example 7 and adapted to form a deposited film for a larger area. The figure correspond to the cross sectional view taken along line $\beta$-$\beta'$ in Example 7.

In Example 7, the size of the substrate in the direction of the shorter axis ($\beta$-$\beta'$) has been restricted by the entire length of the gas introduction ports 501-506 along the direction of the shorter axis ($\beta$-$\beta'$). In this embodiment, however, a bendable substrate 2403 is wound around a roll, which is continuously delivered from a roll 2401 and then taken-up into a roll 2402 making it possible to continuously form a deposited film of a large area in the direction of the shorter axis ($\beta$-$\beta'$). The area can be increased readily in the direction of the longer axis ($\alpha$-$\alpha'$) by increasing the area of the electrodes 2408, 2415. Accordingly, it is possible to form a deposited film readily over a large area with a desired length both in the direction of the longitudinal axis ($\alpha$-$\alpha'$) and in the direction of the shorter axis ($\beta$-$\beta'$).

An example in which an amorphous silicon germanium film (hereinafter simply referred to as a a-SiGe:H film ) was deposited by using the apparatus shown in FIG. 24 is now described.

In FIG. 24, 2408-2415 denote parallel flat electrodes each having the same rectangular shape as that shown in FIG. 22, and the electrodes are insulated from each other by means of insulators such as $SiO_2$, $Al_2O_3$, etc.

$H_2$ at 200 sccm and Ar at 1000 sccm were introduced respectively from gas introduction pipes 2404 and 2407, while RF wave of 120 mW/cm$^2$ was applied by RF wave power sources 2417 and 2420 to electrodes 2408 and 2414 to cause plasmas of a gas mixture of $H_2$ and Ar, thereby forming H* between electrodes 2408 and 2409 and electrodes 2414 and 2415. Simultaneously, $SiF_4$ was introduced at 200 sccm from the introduction pipe 2405, while RF wave of 100 mW/cm$^2$ was applied from an RF power source 2418 to the electrode 2410, to form the active species of $SiF_4$. Further, $GeF_4$ diluted with Ar to 10% was introduced at 100 sccm from a gas introduction port 2406, while RF wave of 30 mW/cm$^2$ was applied from an RF power source 2419 to the electrode 2412, to form active species of $GeF_4$.

Then, the active species formed in the activation space were introduced, that is, the active species of $H_2$ from gas introduction ports 2424 and 2427 each being 2 cm × 30 cm, the active species of $SiF_4$ from a gas introduction port 2425 of 1.5 cm × 30 cm, and the active species of $GeF_4$ from the gas introduction port 2426 of 1 cm × 30 cm into a film-forming space 2421. The gases were mixed and reacted at an inner pressure of 0.3 Torr. An a-SiGe:H film was deposited on a stainless steel substrate 2430 of 30 cm width heated to 240° C. by an IR lamp 2422 while moving the substrate at a rate of 2.5 cm/min.

As an example of the bendable substrate 2403, there can be used aluminum or heat resistant polyester or polyimide in addition to the material described above. The a-SiGe:H film was deposited on the glass substrate, 30 cm × 30 cm in size heated to 240° C. under the above-mentioned conditions. The results of evaluation of the film properties are shown in Table 3, No. 10. Other data show the results obtained by varying the flow rate of $GeF_4$ and the electric power of RF wave for activating $GeF_4$.

Table 3 shows examples of preparing films of different optical band gaps (Egopt) by controlling the activation amount of $GeF_4$ independently thereby changing the composition of a-SiGe:H films. In the conventional method of forming deposited films by decomposing a gas mixture of $SiF_4$ and $GeF_4$ with plasmas, since light conductivity ($\sigma_p$) is lowered, while the dark conductivity ($\sigma_d$) is increased film quality often deteriorates upon forming an a-SiGe:H film of low Egopt. To the contrary, in the apparatus according to the present invention, satisfactory film quality SiGe films with low Egopt can be easily obtained by independently controlling the activation of $GeF_4$.

For the deposited a-SiGe:H film, the distribution of the deposition rate on the substrate was ±3%, the distribution for the ratio x of components in $Si_xGe_{1-x}$ was ±2.5% and the distribution of conductivity $\sigma$ was within 50%. That is, homogenous a-SiGe:H film could be deposited with 30 cm width over a desired length.

Further, deposited films of substantially the same Egopt and different deposition rates could be formed by simultaneously varying the yield of H* and the yield of active species of $SiF_4$ and the yield of active species of $GeF_4$.

As described above, a-SiGe films could be formed homogeneously over a large area by the apparatus for forming the deposited film shown in FIG. 24. Further, by independently controlling the yields for the active species of $SiF_4$ and the active species of $GeF_4$, a-SiGe:H films of good quality with desired band gaps could be easily formed at a desired deposition rate by independently controlling the yields for the active species of $SiF_4$ and the active species of $GeF_4$.

Although the formation of a-SiGe:H films are shown in this example, other deposited films comprising a plurality of compositions can be formed by varying the species of gases.

EXAMPLE 9

The example of depositing an amorphous silicon carbide film (hereinafter simply referred to as a-SiC:H film) by using an apparatus shown in FIG. 24 used in Example 8 is herewith described.

$H_2$ at 250 sccm and He at 800 sccm were introduced respectively from the gas introduction pipes 2404 and 2407, while RF wave of 150 mW/cm$^2$ was applied from the RF wave power sources 2417 and 2420 to the electrodes 2408 and 2414 to cause plasmas of a gas mixture of $H_2$ and He between the electrodes 2408 and 2409, and electrodes 2414 and 2415, to form H*. Simultaneously, $SiF_4$ was introduced at 150 sccm from the gas introduction pipe 2405, while RF wave 120 mW/cm$^2$ was applied by the RF wave power source 2418 to the electrode 2410, to form active species of $SiF_4$. Further, $CH_4$ diluted with He to 10% was introduced at 150 sccm from the gas introduction port 2406 simultaneously, while RF wave of 0 mW/cm$^2$ was applied from the RF wave power source 2419 to the electrode 2412, to form active species of $CH_4$.

Active species formed in the activation space described above were introduced; that is, active species of $H_2$ from the rectangular gas introduction pipes 2424 and 2427 each being 2 cm × 30 cm, active species of $SiF_4$ from the gas introduction pipe 2425 of 1.5 cm × 30 cm size and active species of $CH_4$ from the gas introduction pipe 2426 of 1 cm × 30 cm size into the film-forming space 2421. The active species were mixed and reacted at an inner pressure of 0.35 Torr and an a-SiC:H film was deposited on the stainless steel substrate 2403 and heated to 250° C. by the IR lamp 2422 while moving the substrate at a speed of 2 cm/min.

The a-SiC:H film was deposited on a glass substrate of 30 cm × 30 cm size heated to 250° C. under the above-mentioned conditions and the results of evaluating the film properties are shown in Table 4, No. 14. Other data shows the results where the flow rate of $CH_4$ and the electric power of RF wave for activating $CH_4$ were varied.

Table 4 shows examples of preparing films of different optical band gaps (Egopt) by independently controlling the activation amount of $GeF_4$, thereby changing the composition of the a-SiGe:H film. In the conventional method of forming a deposited film by decomposing a gas mixture of $SiF_4$ and $GeF_4$ with plasmas, since light conductivity ($\sigma_p$) is lowered, while the dark conductivity ($\sigma_d$) is increased, the film quality upon forming a-SiGe:H film of low Egopt often deteriorates. To the contrary, in the apparatus according to the present invention, satisfactory film quality, including SiGe films with low Egopt, could be obtained easily by independently controlling the activation of $GeF_4$.

Further, deposited films of substantially the same Egopt and different deposition rates could be formed by simultaneously varying the yield of H* and the yield of active species of $SiF_4$ and $GeF_4$. As for the deposited a-SiGe:H films, the distribution of the deposition rate on the substrate was ±3%, the distribution for the ratio x of components in $Si_xGe_{1-x}$ was ±2.5% and the distribution of conductivity $\sigma$ was within 40%. That is, homogenous a-SiGe:H films could be deposited with a 30 cm width over a desired length.

As described above, a-SiGe films could be formed homogeneously over a large area by the apparatus for forming the deposited film shown in FIG. 24. Further, by independently controlling the yields of the active species of SiF$_4$ and the active species of GeF$_4$, a-SiGe:H films of good quality with desired band gaps could be easily formed at a desired deposition rate by independently controlling the yields for the active species of SiF$_4$ and the active species of GeF$_4$.

EXAMPLE 10

The example of depositing phosphorus-doped amorphous silicon films (hereinafter simply referred to as P-doped a-SiC:H film) by using the apparatus shown in FIG. 24 used in Example 8 is now described.

H$_4$ at 200 sccm and He at 500 sccm were introduced respectively from the gas introduction pipes 2404 and 2407, while RF wave of 100 mW/cm$^2$ was applied from the RF wave power sources 2427 and 2420 to the electrodes 2408 and 2414, to generate plasmas of a gas mixture of H$_2$ and He between the electrodes 2408 and 2409 and the electrodes 2414 and 2415, to form H*.

Simultaneously, SiH$_4$ was introduced at 100 sccm from the gas introduction pipe 2405, while RF of 80 mW/cm$^2$ was applied by the RF power source 2418 to the electrode 2410 to form active species of SiH$_4$. Further, PH$_3$ diluted with H$_2$ to 2000 ppm was introduced from the gas introduction pipe 2406 simultaneously, while RF power at 60 mW/cm$^2$ was applied from the RF wave power source 2419 to the electrode 2412, to form active species of PH$_3$.

Active species formed in the above-mentioned activation space were introduced; active species of H$_2$ from the gas introduction pipes 2424 and 2427 each of 2 cm×30 cm size, active species of SiH$_4$ from the gas introduction pipe 2425 of 1.5 cm×30 cm and active species of PH$_3$ from the gas introduction pipe 2426 of 1 cm×30 cm, were respectively introduced into the film-forming space 2421. They were mixed and reacted at an inner pressure of 0.5 Torr and P doped a-Si:H film was deposited on the stainless steel substrate 2403 heated to 240° C. by the IR lamp 2422 while moving the substrate at a rate of 2 cm/min.

When a P-doped a-Si:H film was deposited on a glass substrate heated to 240° C. under substantially the same conditions as described above and the film property was evaluated, the film thickness averaged 1.5 μm, the deposition rate averaged 6.3 Å/sec, $\sigma_p = 5.6 \times 10^{-2} \Omega^{-1} \text{cm}^{-1}$, $\sigma_d 5.5 \times 10^{-2} \Omega^{-1} \text{cm}^{-1}$, activation energy $\Delta E = 0.07$ eV and Egopt = 1.74 eV. For the distribution of each of the properties within the plane of the substrate, the film thickness was within ±5%, $\sigma_p$ and $\sigma_d$ was within ±15% and the homogeneity was satisfactory.

As has been described above, P-doped a-Si:H films of homogenous and good quality could be deposited over a large area by using the apparatus for forming the deposited film shown in FIG. 24.

Further, since the yield for the active species of SiH$_4$ and yield for the active species of PH$_3$ could be independently controlled, the phosphorus concentration in P-doped a-Si:H films could be controlled as desired with good reproducibility.

Further, since the yields for H* and the active species for SiH$_4$ could be independently controlled, it was possible to easily control the desired film quality, including amorphous silicon films and microcrystal silicon films. It was also possible to control the deposition rate as desired without deteriorating the film quality. Although a description has been made of an example of P-doped a-Si:H films, it is also possible to form deposited films of other compositions such as boron doped p type amorphous silicon films.

In the apparatus for forming the deposited film according to the third aspect of the present invention, a deposited film of homogenous film quality could be formed over a large area, maintaining the advantage of independently activating a plurality of film-forming starting material gases. A plurality of film-forming starting material gases, are activated into the state of plasmas respectively by applying RF electric field between each plate-like electrode, transporting the thus activated respective film-forming starting material gases in the direction perpendicular to the direction of RF electric field applied, introducing them for mixing from a plurality of gas introduction ports each of a rectangular or elliptic shape, with the length of the longer axis being more than twice that of the shorter axis and disposed in parallel with one another at a distance less than the length of the shorter axis and causing the thus activated film-forming starting gases to react with each other.

A deposited film of a homogenous film quality can be formed over a large area at a reduced cost while having the advantage of carefully controlling the film quality of the deposited film formed and the ratio of the components where the deposited film comprises a plurality of components. This is attained by increasing the selectivity of the starting material gases and extending the range for the film-forming conditions by activating a plurality of film-forming starting material gases independently, thereby controlling the activation ratio for each film-forming starting material gases independently and controlling the yield and the reaction of the respective active species. Additionally, this is achieved by transporting the film-forming starting material gases in the direction perpendicular to the direction of the RF electric field applied, thereby improving the activating efficiency of the film-forming gases and, introducing respective activated film-forming starting material gases into the film-forming space from a plurality of gas introduction ports, each having a rectangular or elliptic shape with the length of the longer axis more than twice the length of the shorter axis and disposed in parallel with one another at a distance less than the length of for the shorter axis.

Furthermore, it is possible to form a deposited film of homogenous film quality with a large width and desired length over a large area by moving the substrate in the direction of the shorter axis.

TABLE 1

| Specimen No. | 1 | 2 | 3 | 4 |
|---|---|---|---|---|
| Flow rate of GeF$_4$/He [sccm] | 400 | 300 | 250 | 200 |
| Microwave power [W] | 200 | 150 | 120 | 100 |
| Deposition rate [Å/sec.] | 24.1 | 22.0 | 19.5 | 16.0 |
| Egopt [eV] | 1.41 | 1.49 | 1.55 | 1.65 |
| $\sigma_p$ [$\Omega^{-1}$ | $9.5 \times 10^{-6}$ | $1.8 \times 10^{-5}$ | $3.3 \times 10^{-5}$ | $4.1 \times 10^{-5}$ |

TABLE 1-continued

| Specimen No. | 1 | 2 | 3 | 4 |
|---|---|---|---|---|
| $\sigma_d$ [$\Omega^{-1}$ cm$^{-1}$] | $3.8 \times 10^{-9}$ | $1.0 \times 10^{-9}$ | $4.5 \times 10^{-10}$ | $7.6 \times 10^{-11}$ |

TABLE 2

| Specimen No. | 5 | 6 | 7 | 8 |
|---|---|---|---|---|
| Flow rate of GeF$_4$/He [sccm] | 120 | 100 | 75 | 50 |
| Temperature of W filament [°C] | 1800 | 1600 | 1600 | 1600 |
| Deposition rate [Å/sec.] | 12.3 | 10.7 | 9.1 | 8.2 |
| Egopt [eV] | 1.42 | 1.51 | 1.56 | 1.63 |
| $\sigma_p$ [$\Omega^{-1}$ cm$^{-1}$] | $1.0 \times 10^{-5}$ | $2.1 \times 10^{-5}$ | $3.6 \times 10^{-5}$ | $4.0 \times 10^{-5}$ |
| $\sigma_d$ [$\Omega^{-1}$ cm$^{-1}$] | $5.3 \times 10^{-9}$ | $1.5 \times 10^{-9}$ | $3.5 \times 10^{-10}$ | $6.6 \times 10^{-11}$ |

TABLE 3

| Specimen No. | 9 | 10 | 11 | 12 |
|---|---|---|---|---|
| Flow rate of GeF$_4$/Ar [sccm] | 140 | 100 | 80 | 70 |
| RF power [mW/cm$^2$] | 45 | 30 | 20 | 15 |
| Deposition rate [Å/sec.] | 7.7 | 7.0 | 6.2 | 5.8 |
| Egopt [eV] | 1.42 | 1.51 | 1.55 | 1.60 |
| $\sigma_p$ [$\Omega^{-1}$ cm$^{-1}$] | $1.5 \times 10^{-5}$ | $2.3 \times 10^{-5}$ | $3.0 \times 10^{-5}$ | $3.2 \times 10^{-5}$ |
| $\sigma_d$ [$\Omega^{-1}$ cm$^{-1}$] | $4.7 \times 10^{-9}$ | $1.3 \times 10^{-9}$ | $3.3 \times 10^{-10}$ | $6.0 \times 10^{-11}$ |

TABLE 4

| Specimen No. | 13 | 14 | 15 | 16 |
|---|---|---|---|---|
| Flow rate of CH$_4$/He [sccm] | 100 | 150 | 200 | 200 |
| RF power [mW/cm$^2$] | 50 | 80 | 100 | 140 |
| Deposition rate [Å/sec.] | 5.2 | 5.5 | 6.3 | 7.0 |
| Egopt [eV] | 1.85 | 1.93 | 2.10 | 2.22 |
| $\sigma_p$ [$\Omega^{-1}$ cm$^{-1}$] | $2.7 \times 10^{-5}$ | $1.9 \times 10^{-5}$ | $1.1 \times 10^{-5}$ | $8.8 \times 10^{-6}$ |
| $\sigma_d$ [$\Omega^{-1}$ cm$^{-1}$] | $3.1 \times 10^{-11}$ | $1.2 \times 10^{-11}$ | $5.8 \times 10^{-12}$ | $3.1 \times 10^{-12}$ |

What we claim is:

1. An apparatus for forming a functional deposited film on the surface of a substrate by way of plasma reaction among activated gases formed separately from at least two film-forming raw material gases, said apparatus comprising:

(a) a film-forming chamber having a substrate holder provided with means for heating said substrate disposed on the surface of said substrate holder; and (b) at least two activation chambers, each said activation chamber being provided with (i) means for supplying a film-forming raw material gas thereinto; (ii) means for decomposing said film-forming raw material gas; (iii) a filament made of a metallic material capable of exhibiting a catalytic effect to activate said film-forming raw material gas into a plasma state upon application of an electric power thereto, the activated gases being transported in a direction perpendicular to the direction of the longer axis of said filament; and (iv) a gas introduction port for introducing the activated gaseous material into said film-forming chamber, each said gas introduction port having (iv-a) an opening near the surface of said substrate; (iv-b) a rectangular or elliptic shape with the length of the longer axis being at least twice the length of the shorter axis and (iv-c) a position parallel to each other at a distance less than the length of the shorter axis.

2. The apparatus according to claim 1, further comprising means for moving said substrate in a direction perpendicular to the longer axis of each of the said gas introduction port.

* * * * *

UNITED STATES PATENT AND TRADEMARK OFFICE
CERTIFICATE OF CORRECTION

PATENT NO. : 5,149,375
DATED : September 22, 1992
INVENTOR(S) : JINSHO MATSUYAMA It is certified that error appears in the above-identified patent and that said Letters Patent is hereby corrected as shown below:

COLUMN 6

Line 13, "FIG. 21" should read --FIG. 21.--.

COLUMN 15

Line 15, "$v_p$" should read --$\sigma_p$--.
Line 16, "$\sigma_d = 7.8 \times 10^{-12} \Omega^{-1} cm^{-1} cm^{-1}$" should read --$\sigma_d = 7.8 \times 10^{-12} \Omega^{-1} cm^{-1}$--.
Line 65, "1706" should read --1706.--.

COLUMN 17

Line 44, "P doped" should read --P-doped--.
Line 57, "P doped" should read --P-doped--.

COLUMN 18

Line 2, "P doped" should read --P-doped--.
Line 5, "P type" should read --P-type--.

COLUMN 19

Line 57, "$PH_4$" should read --$PH_3$--.

COLUMN 20

Line 1, "boron doped" should read --boron-doped-- and "p type" should read --P-type--.
Line 26, "FIG. 2" should read --FIG. 20--.

UNITED STATES PATENT AND TRADEMARK OFFICE
CERTIFICATE OF CORRECTION

PATENT NO. : 5,149,375
DATED : September 22, 1992
INVENTOR(S) : JINSHO MATSUYAMA It is certified that error appears in the above-identified patent and that said Letters Patent is hereby corrected as shown below:

COLUMN 21

Line 50, "$Hk_2$," should read --$H_2$,--.

COLUMN 23

Line 62, "mW/cm" should read --$mW/cm^2$--.

COLUMN 24

Line 39, "correspond" should read --corresponds--.

COLUMN 25

Line 28, "size" should read --size,--.

COLUMN 27

Line 40, "P doped" should read --P-doped--.
Line 59, "SiH-" should read --$SiH_4$--.
Line 60, "$_4$and" should read --and--.

COLUMN 28

Line 4, "boron doped p type" should read
--boron-doped P-type--.

UNITED STATES PATENT AND TRADEMARK OFFICE
CERTIFICATE OF CORRECTION

PATENT NO. : 5,149,375
DATED : September 22, 1992
INVENTOR(S) : JINSHO MATSUYAMA It is certified that error appears in the above-identified patent and that said Letters Patent is hereby corrected as shown below:

<u>COLUMN 30</u>

Line 22, "we claim is:" should read --is claimed is:--.
Line 46, "t he" should read --the--.

Signed and Sealed this

Eighth Day of March, 1994

Attest:

BRUCE LEHMAN

*Attesting Officer*   *Commissioner of Patents and Trademarks*